(12) United States Patent
Nakasugi

(10) Patent No.: US 7,283,885 B2
(45) Date of Patent: Oct. 16, 2007

(54) ELECTRON BEAM LITHOGRAPHY SYSTEM, METHOD OF ELECTRON BEAM LITHOGRAPHY, PROGRAM AND METHOD FOR MANUFACTURING A SEMICONDUCTOR DEVICE WITH DIRECT WRITING

(75) Inventor: Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 11/097,357

(22) Filed: Apr. 4, 2005

(65) Prior Publication Data

US 2005/0256600 A1    Nov. 17, 2005

(30) Foreign Application Priority Data

Apr. 5, 2004    (JP) .......................... P2004-111291

(51) Int. Cl.
*G06F 19/00*    (2006.01)
(52) U.S. Cl. ....................... 700/100; 700/121
(58) Field of Classification Search ............. 700/100, 700/102, 121
See application file for complete search history.

(56) References Cited

U.S. PATENT DOCUMENTS

| | | | | |
|---|---|---|---|---|
| 5,141,830 | A * | 8/1992 | Komagata | 430/30 |
| 6,225,025 | B1 | 5/2001 | Hoshino | |
| 6,393,604 | B1 * | 5/2002 | Yamada et al. | 716/21 |
| 6,657,211 | B2 * | 12/2003 | Benner | 250/492.22 |
| 6,674,086 | B2 | 1/2004 | Kamada et al. | |
| 6,803,589 | B2 * | 10/2004 | Nakasugi | 250/492.22 |
| 2002/0017708 | A1 * | 2/2002 | Takagi et al. | 257/678 |
| 2002/0173868 | A1 * | 11/2002 | Mukuta et al. | 700/100 |
| 2003/0089685 | A1 * | 5/2003 | Ando | 219/121.12 |
| 2003/0160192 | A1 * | 8/2003 | Inanami et al. | 250/492.23 |
| 2004/0011966 | A1 * | 1/2004 | Sasaki et al. | 250/492.1 |
| 2004/0065848 | A1 * | 4/2004 | Onishi et al. | 250/492.1 |
| 2005/0208772 | A1 * | 9/2005 | Inanami | 438/712 |

OTHER PUBLICATIONS

Tominaga, T. et al. "Scheduling in electron-beam direct writing system employing character projection exposure method", Proceeding of LSI Testing Symposium 2004 (Japan) 7 pages, Nov. 2004.

* cited by examiner

*Primary Examiner*—Leo Picard
*Assistant Examiner*—Sheela Rao
(74) *Attorney, Agent, or Firm*—Finnegan, Henderson, Farabow, Garrett & Dunner, L.L.P.

(57) ABSTRACT

An electron beam lithography system includes: a lithography tool writing patterns onto substrates, which are classified into lots, respectively, using sequentially apertures through which electron beams, based on a specific processing procedures; an aperture manager managing the apertures; a request obtaining module obtaining processing requests of the lots; a processing procedure storing file storing processing procedures; a processing time calculating module calculating corresponding processing times of the lots using the apertures based on corresponding processing procedures defined for each of the lots; and an order deciding module deciding an order of processing the lots based on the processing times.

20 Claims, 26 Drawing Sheets

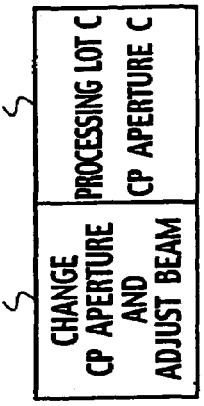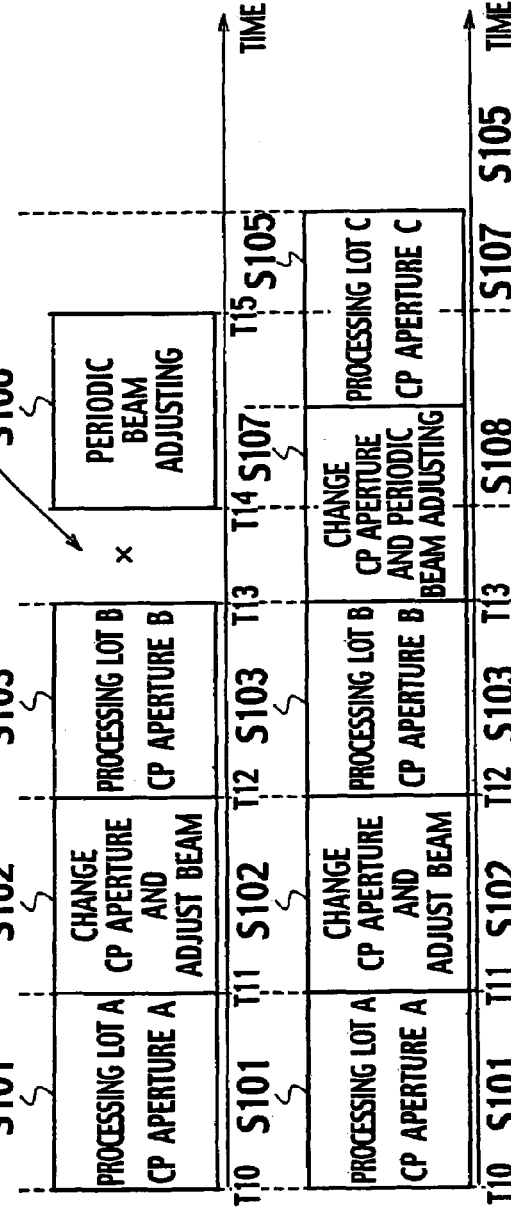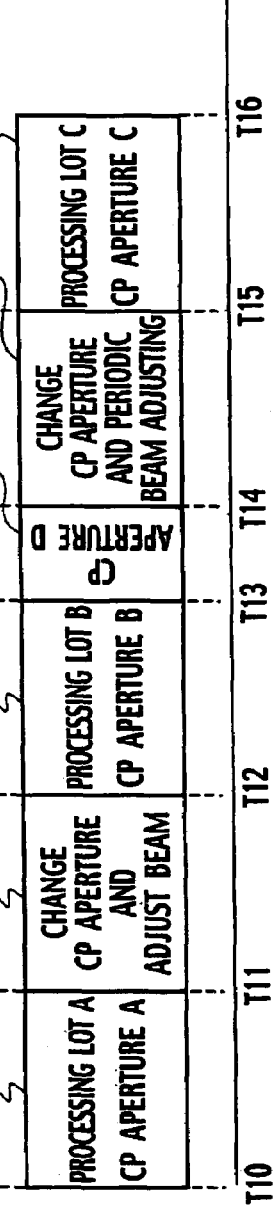
FIG. 3A
FIG. 3B
FIG. 3C

FIG. 8

| PRODUCT NAME | NUMBER OF WIRING LAYER | CP INFORMATION | NUMBER OF CHIPS/WAFER | NUMBER OF LOTS/DAY |
|---|---|---|---|---|
| A | 8 | 3 | 200 | 3 |
| B | 5 | 2 | 300 | 2 |
| C | 8 | 3 | 400 | 3 |
| ⋮ | | | ⋮ | |
| J | 7 | 2 | 300 | 0.2 |

FIG. 9

| PRODUCT NAME J | | |
|---|---|---|
| WIRING | APERTURE | CP | NUMBER OF SHOTS / CHIP |
| M1 | A2 | CP1 | 20M |
| | | CP2 | |
| | | CP3 | |
| V1 | A2 | CP20 | 10M |
| | | ⋮ | ⋮ |
| V5 | A2 | CP50 | |
| M6 | A2 | CP61 | 2M |
| | | CP62 | 3M |
| | | CP67 | |

| PRODUCT NAME C | | | |
|---|---|---|---|
| WIRING | APERTURE | CP | NUMBER OF SHOTS / CHIP |

| PRODUCT NAME B | | | |
|---|---|---|---|
| WIRING | APERTURE | CP | NUMBER OF SHOTS / CHIP |

| PRODUCT NAME A | | | |
|---|---|---|---|
| WIRING | APERTURE | CP | NUMBER OF SHOTS / CHIP |
| M1 | A1 | CP1 | 10M |
| | | CP2 | |
| | | CP3 | |
| V1 | A1 | CP20 | 5M |
| | | ⋮ | ⋮ |
| V7 | A1 | CP70 | 2M |
| V8 | A1 | CP81 | 3M |
| | | CP82 | |
| | | CP89 | |

FIG. 27A

| CANDIDATE NO. | EVALUATION VALUE |
|---|---|
| K1 | 75 |
| K2 | 77 |
| ⋮ | ⋮ |
| K39 | 128 |
| K40 | 129 |
| K41 | 129 |
| ⋮ | ⋮ |
| K50 | 270 |

FIG. 27B

| CANDIDATE NO. | EVALUATION VALUE |
|---|---|
| K1 | 75 |
| K1 | 75 |
| K2 | 77 |
| K2 | 77 |
| ⋮ | ⋮ |
| K10 | 90 |
| K10 | 90 |
| ⋮ | ⋮ |
| K40 | 129 |

ELECTRON BEAM LITHOGRAPHY SYSTEM, METHOD OF ELECTRON BEAM LITHOGRAPHY, PROGRAM AND METHOD FOR MANUFACTURING A SEMICONDUCTOR DEVICE WITH DIRECT WRITING

CROSS REFERENCE TO RELATED APPLICATIONS AND INCORPORATED BY REFERENCE

The application is based upon and claims the benefit of priority from the prior Japanese Patent Applications No. P2004-111291, filed on Apr. 5, 2004; the entire contents of which are incorporated herein by reference.

BACKGROUND OF THE INVENTION

1. Field of the Invention

The present invention relates to direct writing technology, more particularly, to an electron beam (EB) lithography system, a method for EB lithography, a program and a method for manufacturing a semiconductor device with direct writing.

2. Description of the Related Art

The mainstream of semiconductor device manufacturing has been a form of mass-producing single products, such as dynamic random access memory (DRAM). The costs of masks used for a photolithography process can be absorbed by mass-producing chips. Recently, however, the mainstream of production has changed from a large-volume small variety device, such as DRAM, to a large-variety small volume device, such as application specific integrated circuit (ASIC). Accordingly, conventional photolithography using masks has changed to direct writing by an EB lithography system.

In the direct writing using the EB lithography system, character projection (CP) lithography has been used to improve throughput. In the CP lithography, a plurality of character patterns are written collectively on a semiconductor wafer by using a perforated mask called a CP aperture, in which a repeatedly used graphic pattern is formed as a "character pattern". According to CP lithography, the number of shots is reduced by batch-writing, thereby improving throughput.

However, in CP lithography, in the case of manufacturing of a large-variety small volume device, a character pattern is formed for each product at present. Accordingly, CP apertures must be frequently changed for each plurality of lots to be processed. Thus, a CP aperture change time and a beam adjusting time which is ancillary to the changing of the CP aperture are necessary, causing a reduction in capacity operating rate of the EB lithography system in some cases. Under the present circumstances a large throughput increase is difficult to achieve solely by hardware performance. Thus, there is a demand for production schedule in which a processing (writing) sequence of a plurality of lots is more productive.

SUMMARY OF THE INVENTION

An aspect of the present invention inheres in an electron beam lithography system including: a lithography tool configured to write patterns onto a plurality of substrates, which are classified into a plurality of lots, respectively, using sequentially a plurality of apertures through which electron beams; an aperture manager configured to manage the apertures; a request obtaining module configured to obtain a plurality of processing requests for each of the lots; a processing procedure storing file storing a plurality of processing procedures defined for each of the lots; a processing time calculating module configured to calculate corresponding processing times of each of the lots using the apertures based on corresponding processing procedures; and an order deciding module configured to decide an order of processing the lots based on each of the processing times for each of the lots.

Another aspect of the present invention inheres in a computer implemented method of electron beam lithography including: obtaining a plurality of processing requests for each of a plurality of lots; calculating corresponding processing times of each of the lots using a plurality of apertures based on a plurality of processing procedures defined for each of the lots; deciding an order of processing the lots based on each of the processing times for each of the lots; and writing patterns onto a plurality of substrates, which are classified into the lots, respectively, using sequentially the apertures through which electron beams, based on the order.

An additional aspect of the present invention inheres in a program configured to be executed by a computer for executing an application on an electron beam lithography system, the program including: instructions for obtaining a plurality of processing requests for each of a plurality of lots; instructions for calculating corresponding processing times of each of the lots using a plurality of apertures based on a plurality of processing procedures defined for each of the lots; instructions for deciding an order of processing the lots based on each of the processing times for each of the lots; and instructions for writing patterns onto a plurality of substrates, which are classified into the lots, respectively, using sequentially the apertures through which electron beams, based on the order.

Further additional aspect of the present invention inheres in A method for manufacturing a semiconductor device using direct writing, including: generating layout data of device patterns of a plurality of lots; converting the layout data of each of the lots into lithography data; obtaining a plurality of processing requests for each of the lots; calculating corresponding processing times of each of the lots using a plurality of apertures based on a plurality of processing procedures defined for each of the lots; deciding an order of processing the lots based on each of the processing times for each of the lots; and writing patterns onto a plurality of substrates, which are classified into the lots, respectively, using sequentially the apertures through which electron beams, based on the order.

BRIEF DESCRIPTION OF THE DRAWINGS

FIGS. 3A to 3C and 4 are timing charts showing a schedule according to the embodiment of the present invention.

FIG. 8 is a graph showing an example of lot information according to the embodiment of the present invention.

FIG. 9 is a graph showing an example of CP aperture information according to the embodiment of the present invention.

FIGS. 26A, 26B, 27A, 27B, 28, 29A and 29B are schematic views for explaining hereditary processing according to the second modification of the present invention.

DETAILED DESCRIPTION OF THE INVENTION

Figure 1:
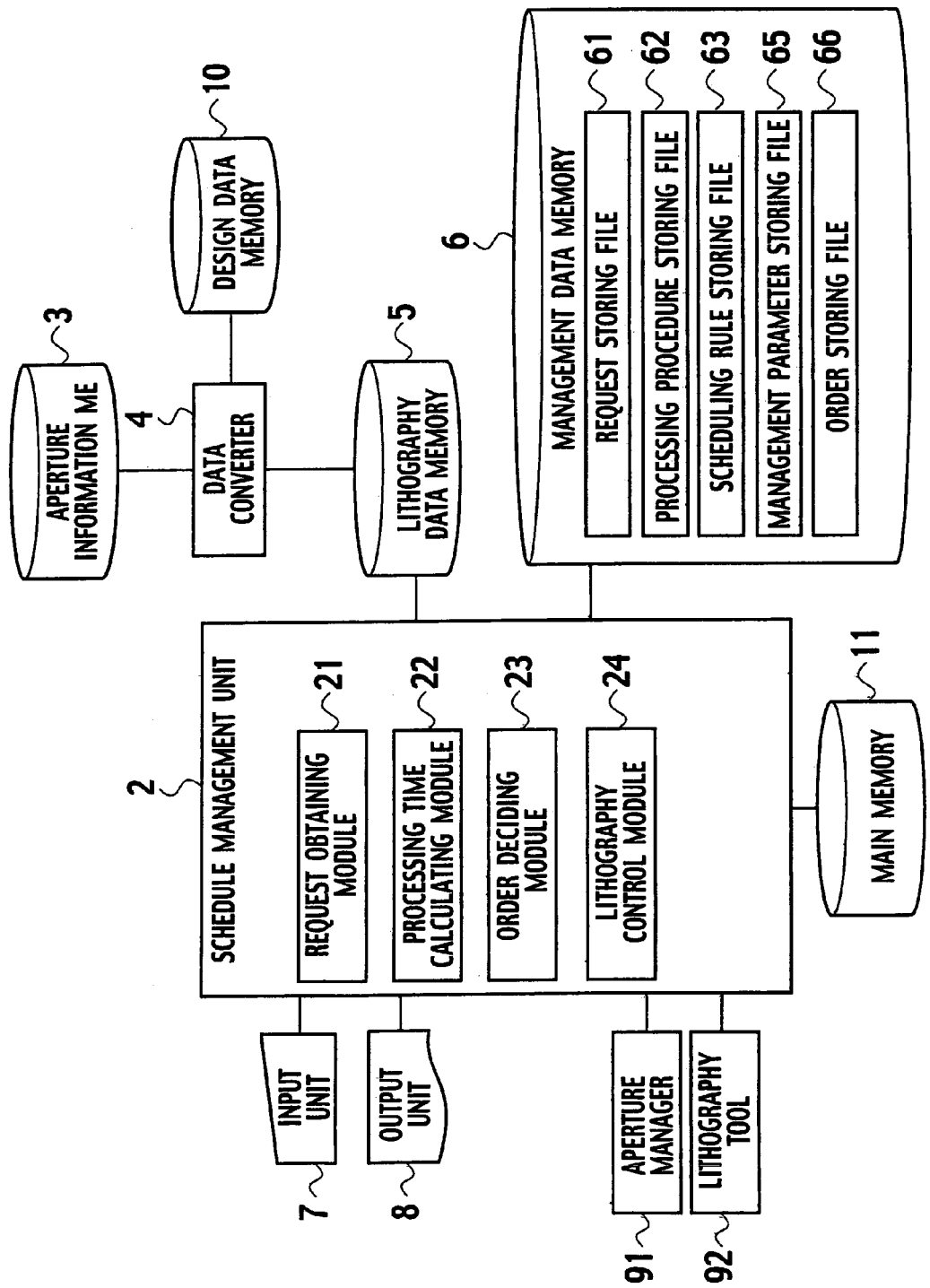
FIG. 1 is a block diagram showing an EB lithography system according to the embodiment of the present invention.

An embodiment and modifications of the present invention will be described with reference to the accompanying drawings. It is to be noted that the same or similar reference numerals are applied to the same or similar parts and elements throughout the drawings, and the description of the same or similar parts and elements will be omitted or simplified.

details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Referring to FIG. 1, an electron beam (EB) lithography system according to an embodiment of the present invention includes a design data memory 10, an aperture information memory 3, a data converter 4, a lithography data memory 5, a management data memory 6, a schedule management unit (CPU) 2, an input unit 7, an output unit 8, a main memory 11, an aperture manager 91, and a lithography tool 92.

The aperture information memory 3 is managed by the aperture manager 91, and stores information regarding a CP aperture mounted on the lithography tool 92 (referred to as "aperture information", hereinafter). The "aperture information" contains pieces or units of information on a lithography process time when a character pattern of the CP aperture is written on a semiconductor wafer by the lithography tool 92, a use frequency of the cp aperture, and the like. The aperture information is managed by a cell name or intrinsic ID for each kind of CP aperture.

A plurality of CP apertures managed by the aperture manager 91 are masks in which a plurality of character patterns which can be written on the semiconductor wafer of a writing object are formed. In the EB lithography system shown in FIG. 1, the plurality of character patterns of the CP apertures are written collectively on the semiconductor wafer of the writing object based on direct writing by the lithography tool 92. The CP apertures may be prepared for, for example, each product group of applications such as an image processing LSI, a wireless communication LSI, and a voice processing LSI. The CP aperture may contain, e.g., an intrinsic character pattern group constituting a function block necessary for each application, and a character pattern group constituting a generally used basic logic element, memory or I/O. The CP apertures may be prepared for device rules such as a 0.18 μm rule, a 0.25 μm rule, and a 0.1 μm rule. The CP apertures may be prepared for device layers such as a transistor element region layer, a gate layer, a contact hole layer, and a wiring layer. Additionally, the plurality of CP apertures may be prepared for lithography conditions such as a maximum beam size of 5 μm, 2 μm or 1 μm.

The design data memory 10 stores design data of LSI patterns formed on the semiconductor wafer. The data converter 4 converts the design data stored in the design data memory 10 into lithography data. The data converter 4 extracts pieces or units of aperture information regarding the plurality of CP apertures optimal for writing lithography data patterns based on the lithography time, the use frequency of CP apertures and the like contained in the aperture information stored in the aperture information memory. The lithography pattern memory device 5 stores the lithography data generated by the data converter 4, and the aperture information regarding the plurality of CP apertures optimal for writing the lithography data patterns.

The management data memory 6 includes a request storing file 61, a processing procedure storing file 62, a scheduling rule storing file 63, a management parameter storing file 65, and an order storing file 66. The request storing file 61 stores a lot processing request obtained by a request obtaining module 21 of the CPU 2. The term "lot" refers to a collection of semiconductor wafers processed (direct writing is carried on the photoresist coated on the semiconductor wafers) by the lithography tool 92 within a fixed period. A plurality of lots are different from one another in processing time, the CP aperture optimal for writing, priority, processing procedure and the like, because each of the lots corresponds to different types of integrated circuits. The request storing file 61 stores a job shop containing a queuing list for registering lots as jobs and an event list.

The processing procedure storing file 62 stores the lot processing procedure for each lot. The processing procedure contains the types of CP apertures used for lot processing, lot priority, and lot lithography conditions. The lithography conditions include parameters such as a main deflection field size, a sub-deflection field size, an amount of resist writing, the number of time of multiple-writing, desired writing accuracy, a beam size, a stage driving method and the like. The lot priority may be obtained by the request obtaining module 21, and stored in the lot processing request stored in the request storing file 61.

The scheduling rule storing file 63 stores a scheduling rule for deciding an order of processing a plurality of lots requested to be processed. The scheduling rule can be optionally set through the input unit 7 by a user. As a scheduling rule, for example, a priority rule called a dispatching rule can be used. Depending on characteristics, the dispatching rule can be classified into, e.g., a fixed rule, a dynamic rule, a rule which takes a preparation time into consideration ("preparation rule" hereinafter), and the like. The fixed rule establishes priority among lots irrespective of a lot progressing situation or a job shop situation in the request storing file 61. The fixed rule includes a shop first-come first-served rule for giving priority to a lot for which a production instruction comes first, an earliest delivery rule for giving priority to a lot requiring early delivery, a first-in first-out rule (FIFO rule) for giving priority to a lot arriving first at the EB lithography system in which processing is carried out, and a shortest processing time rule (SPT rule) for giving priority to a lot requiring a minimum work time at the EB lithography system in which the processing is carried out. The fixed rule further includes a priority designation rule for giving priority to a lot of high priority stored in the processing procedure stored in the processing procedure storing file 62.

The dynamic rule establishes priority among lots in accordance with a lot progress situation or a shop situation. For example, a lot slow in progress due to processing at the EB lithography system of a long queue is preferably given higher priority than a steadily progressing lot. Further, the dynamic rule includes a minimum slack rule for giving priority to a minimum slack lot until delivery, a most work remaining rule (MWKR rule) for giving priority to a lot requiring a maximum work time remaining to be carried out, from among scheduled work, and a least work remaining rule (LWKR rule) for giving priority to a lot needing a minimum work time to be completed in the future. The dynamic rule further includes a reinput lot prediction rule for predicting rearrival time of an EB lithography processing for another layer through a lithography step and changing to the necessary apertures beforehand.

The preparation rule is used when a preparation time is larger than a processing time of the EB lithography system and a lot size is variable, or when a length of a preparation time is changed by a sequence of lots processed at the EB lithography system. Further, the preparation rule includes a minimum adjusting work time rule for giving priority to a lot having the smallest sum of a preparation time and work time, and a minimum work-in-progress inventory rule for switching from a currently produced variety of lots to a variety of lots of a minimum inventory of work in progress when the inventory of work in progress reaches a reference volume. In the case of the minimum adjusting work time rule, work is treated by setting a preparatory time to 0 if the work is carried out by the same preparation, increasing the possibility that priority will be given to a lot requiring the same preparation. For the minimum adjusting work time rule, by setting an aperture changing time as a preparation time, a minimum aperture changing rule for changing the processing procedure again, so that the number of aperture changing times can be minimized is included. Further, the preparation rule includes a time designation rule for allocating schedule times beforehand while considering a schedule time such as a beam adjusting time as a preparation time, and arraying lots to prevent overlapping of lot processing with the beam adjusting time. Here, the "schedule time" includes, e.g., a time optionally set by the user, or a time of periodic beam adjustment carried out for the lithography tool 92.

The management parameter storing file 65 stores management parameters, such as the elapsed time from the last beam adjustment carried out for the lithography tool 92, beam accuracy of the lithography tool 92, and a schedule time. The periodic beam adjustment is scheduled based on the elapsed time from the last beam adjusting time.

The CPU 2 includes the request obtaining module 21, a processing time calculating module 22, an order deciding module 23, and a lithography control module 24. The request obtaining module 21 obtains a plurality of lot processing requests for each of lots which are input through the input unit 7 by the user and which use corresponding CP apertures. The plurality of lot processing requests may be input from a host computer (not shown).

The processing time calculating module 22 reads the lot processing requests obtained by the request obtaining module 21, and calculates corresponding processing times necessary for each of the plurality of lots by using the CP apertures corresponding to the lots based on the corresponding processing procedures stored in the processing procedure storing file 62 and the lithography data or the like stored in the lithography data memory 5. Here, the processing time includes the processing time necessary for processing a lot by using a CP aperture currently mounted on the lithography tool 92, a CP aperture changing time, a beam adjusting time, and the processing time necessary for processing a lot by using a changeable CP aperture.

The order deciding module 23 performs simulation based on the scheduling rule stored in the scheduling rule storing file 63, the lot processing request stored in the request storing file 61, the processing procedure stored in the processing procedure storing file 62, the processing time calculated by the processing time calculating module 22, and the aperture information stored in the lithography data storing file 5, and incorporates a CP aperture changing time or a beam adjusting time to decide an order when CP aperture changing or beam adjusting is necessary for the plurality of lots requested to be processed.

The simulation of the order deciding module 23 can use a method for making a schedule by repeating a procedure of selecting one processing object from a queue before the device, the machine and the worker and processing the selected processing object, based on, e.g., the dispatching rule. The simulation is classified into forward simulation for calculating from the present to the future, and backward simulation for calculating from the future to the past. According to the embodiment, event driving type simulation is used in which only an occurrence time of a phenomenon causing a state change is considered to show a job shop change. Additionally, hybrid simulation is used, which is a method of obtaining an ideal start time of each process for all of the lots and deciding priority among the processes based on the start time, by using the backward simulation.

Figure 2:
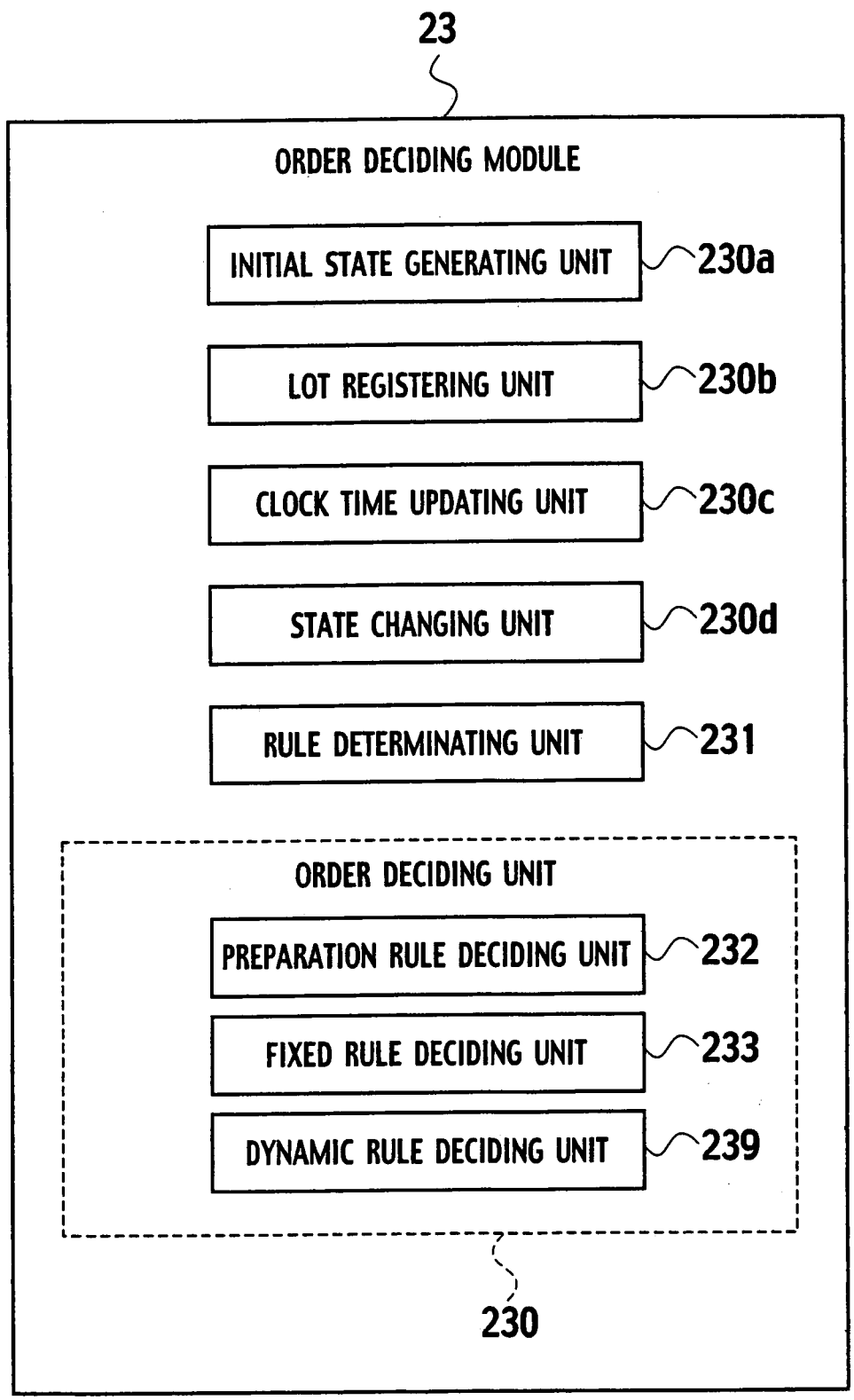
FIG. 2 is a block diagram showing an order deciding module according to the embodiment of the present invention.

For example, as shown in FIG. 2, the order deciding module 23 includes an initial state generating unit 230a, a lot registering unit 230b, a clock time updating unit 230c, a state changing unit 230d, a rule determining unit 231, and an order deciding unit 230. The initial state generating unit 230a reads the lot processing request obtained by the request obtaining module 21 shown in FIG. 1, and registers the lot requested to be processed as a job in the job shop of the request storing file 61, thereby creating an initial state of the job shop. The lots in the job shop are all in a queue, currently processed or carried. The lots in the queue are registered in the queuing list of the job shop. The currently processed lots are registered as end event lots in the event list of the job shop. The currently carried lots are also registered as end event lots in the event list after a predicted arrival time is calculated.

The lot registering unit 230b shown in FIG. 2 registers lots obtained by the request obtaining module 21 shown in FIG. 1 and scheduled to arrive, from the outside, in the job shop. After a scheduled arrival time is calculated, each of the lots scheduled to arrive from the outside is registered as an arrival event lot in the event list. For the lots scheduled to arrive from the outside, a method of deciding all the schedules at the time of starting simulation and registering the lots altogether, a method of periodically registering the lots, a method of randomly selecting a time and registering the lots, or the like is used.

The clock time updating unit 230c shown in FIG. 2 advances a clock time to an earliest occurrence time of the event list, and determines whether the clock time is past a simulation end time or not. A plurality of events may occur at the same time. In this case, however, no troubles will occur even if the events are sequentially processed without updating the clock time.

The state changing unit 230d writes data of an arrived lot in the queuing list of the corresponding EB lithography system. If the EB lithography is in an idle state, the lot is written in the queuing list, and thus the lot is allocated to the EB lithography system. Further, a work time of the lot is added to the clock time, and the lot is written again as an end event occurrence time in the event list. On the other hand, if the EB lithography system is not in an idle state, a length of the queue is increased by one because of the arrival of the lot.

If the finished event is the last work process for the lot, the state changing unit 230d calculates statistics such as a production lead time or delivery delay On the other hand, if the event is not the last work process, a carrying time is added to the clock time, and data is written again as an arrived event occurrence time at the EB lithography system in which next work process is carried out in the event list. Further, the state changing unit 230d determines whether there is a queue or not in the work-finished EB lithography system.

If there is a queue in the EB lithography system, the rule determining unit 231 reads the scheduling rule, such as a dispatching rule, stored in the schedule storing file 63, and determines a scheduling rule for the plurality of lots requested to be processed. The scheduling rule determined here may be one kind of a dispatching rule or a primary combination (linear combination) of plurality of types of dispatching rules.

The order deciding unit 230 decides an order of processing the plurality of lots in the queue in accordance with the scheduling rule determined by the rule determining unit 231, based on each of the processing times for each of the plurality of lots. For example, the order deciding unit 230 includes a preparation rule deciding unit 232, a fixed rule deciding unit 233, and a dynamic rule deciding unit 239. The preparation rule deciding unit 232 decides an order of processing the lot by considering the preparation time if the scheduling rule is determined to be a preparation rule by the rule determining unit 231. For example, if the scheduling rule is determined to be a time designation rule in the preparation rule by the rule determining unit 231, the preparation rule deciding unit 232 allocates the schedule time stored in the management parameter storing file 65 in advance, and allocates processing of the lots requested to be processed so as to not overlap with the allocated schedule time.

As shown in FIG. 3A, in accordance with the time designation rule, the preparation rule deciding unit 232 calculates periodic beam adjusting times T14 to T16 based on, e.g., the elapsed time from the last beam adjustment stored in the management parameter storing file 65, and allocates periodic beam adjustments of a step S106 to the calculated times T14 to T16. The preparation rule deciding unit 232 allocates processing of a lot A of a step S101, CP aperture changes and beam adjustment of a step S102, and processing of a lot B of a step S103 to the times T10 to T11, T11 to T12, and T12 to T13 before the start time T14 of the periodic beam adjustment of the step S106. Further, if there are CP aperture changes and a beam adjusting time of the step S104 and processing of a lot C of a step S105 which is not completed before the periodic beam adjustment start time T14 of the step S106, the preparation rule deciding unit 232 matches and incorporates the beam adjustment of the step S104 with the periodic beam adjustment of the step S106, as CP aperture changes and periodic beam adjustment of a step S107 in the time T13 to T15, as shown in FIG. 3B. Further, the preparation rule deciding unit 232 allocates processing of the lot C to the time T15 to T17.

After the allocation of the periodic beam adjusting step of the step S106 shown in FIG. 3A, the preparation rule deciding unit 232 may allocate the beam adjustment of the step S104 together with the periodic beam adjustment of the step S106 as the CP aperture change and periodic beam adjustment of the step S107 to the times T14 to T15 as shown in FIG. 3C. Further, the preparation rule deciding unit 232 may allocate processing of a lot D which can be processed in the times T13 to T14. In this case, the preparation rule deciding unit 232 allocates the processing of the lot C of the step S105 to the time T15 to T16.

The preparation rule deciding unit 232 may give priority to a lot in which a sum of a preparation time and a work processing time is a minimum in accordance with the minimum adjusting work time rule. Alternatively, in accordance with the minimum work-in-progress inventory rule, the preparation rule deciding unit 232 may switch a currently produced variety of lots to a variety of lots of a minimum work-in-progress inventory when the inventory of work in progress reaches a reference volume. Furthermore, in accordance with the minimum aperture changing rule in the minimum adjusting work time rule, the preparation rule deciding unit 232 may rearrange the order of processing the lots so that the number of aperture change times can be minimized.

Figure 4:
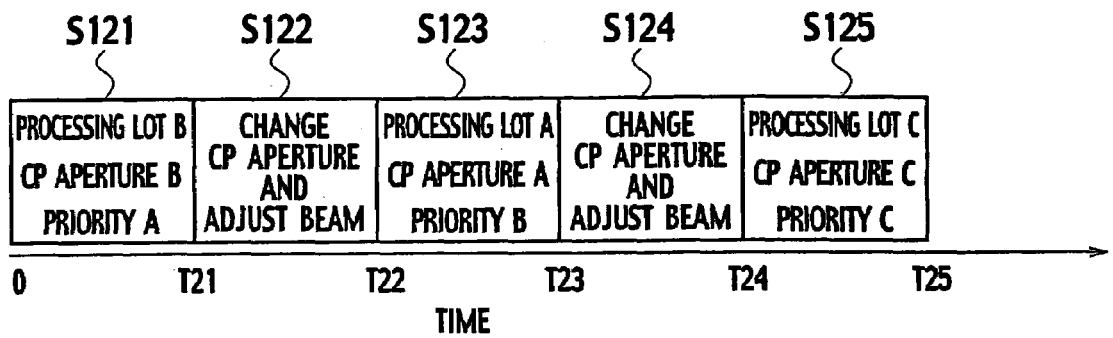

The fixed rule deciding unit 233 shown in FIG. 2 decides an order of processing the lots in accordance with the type of fixed rule when the scheduling rule is determined to be the fixed rule by the rule determining unit 231. For example, in accordance with the priority designation rule, based on the priority established in the processing procedure stored in the processing procedure storing file 62 shown in FIG. 1, the fixed rule deciding unit 233 extracts lots of high priority and sequentially allocates the lots to a time axis. For example, if an order of priority in a descending order is priority A, priority B, priority C, . . . , as shown in FIG. 4, the fixed rule deciding unit 233 allocates processing of the lot B of the priority A of a step S121 to the times T20 to T21, CP aperture changes and beam adjustment of a step S122 to the times T21 to T22, processing of the lot A of the priority B of a step S123 to the times T22 to T23, CP aperture changes and beam adjustment of a step S124 to the times T23 to T24, and processing of the lot C of the priority C of a step S125 to the times T24 to T25.

In accordance with the shop first-come first-served rule, the fixed rule deciding unit 233 may give priority to a lot for which a production instruction comes first. Alternatively, the fixed rule deciding unit 233 may give priority to a lot requiring earliest delivery in accordance with the earliest delivery rule. Otherwise, in accordance with the FIFO rule, the fixed rule deciding unit 233 may give priority to a lot arriving first at the EB lithography system in which processing is carried out. Otherwise, in accordance with the SPT rule, the fixed rule deciding unit 233 may give priority to a lot requiring a minimum work time at the EB lithography system in which the processing is carried out.

The dynamic rule deciding unit 239 gives priority to a lot of a minimum slack until delivery in accordance with, e.g., the minimum slack rule. Alternatively, in accordance with the MWKR rule, the dynamic rule deciding unit 239 may give priority to a lot of a maximum required time of processing to be carried out in the future, from among scheduled work processing. Otherwise, in accordance with the LWKR rule, the dynamic rule deciding unit 239 may give priority to a lot of a minimum required time of processing in the future. Otherwise, in accordance with the reinput lot prediction rule, the dynamic rule deciding unit 239 may predict a rearrival time at EB lithography processing of a next layer through a lithography process, and change to necessary CP apertures beforehand.

The lithography control module 24 shown in FIG. 1 outputs a control signal for controlling processing of a plurality of lots to the aperture manager 91 and the lithography tool 92 based on the order of processing the lots decided by the order deciding module 23, the lithography data stored in the lithography data memory 5 and a specific processing procedures defined for each of the lots stored in the processing procedure storing file 62. The aperture manager 91 manages a plurality of CP apertures which can be mounted on the lithography tool 92, and changes the CP apertures of the lithography tool 92 based on the control signal output from the lithography control module 24. The lithography tool 92 writes a plurality of character patterns (images) of the CP apertures collectively onto substrates (semiconductor wafers), which are classified into a plurality of the lots, respectively, using sequentially the CP apertures through which electron beams by the direct writing, thereby sequentially processing the plurality of lots.

Using the input unit 7, the processing request of the lots, scheduling rules and so on. The input unit 5, shown in FIG. 2, may be, for example, a keyboard, a mouse, a recognition device such as an optical character readers (OCR), a drawing input device such as an image scanner, or a special input unit such as a voice input device. The output unit 8 can display the order of processing the plurality of lots decided by CPU 2 with a screen (monitor) and can print the processing result of CPU 2. The output unit 8 may be a display device such as a liquid crystal display (LCD), CRT display, or a printing device such as an ink jet printer or a laser printer.

The main memory 11 includes read-only memory (ROM) and random-access memory (RAM). The ROM stores a program executed by the CPU 2 (the details of the program are described later). The RAM serves as a temporary data memory for storing data used in executing a program by the CPU 2, and used as a working domain. As the main memory 11, a flexible disk, a CD-ROM, a MO disk, a cassette tape and an open reel tape, etc. can be used.

The EB lithography system shown in FIG. 1 has an input/output manager (interface) (not shown) connecting the input unit 7, the output unit 8 and so on to the CPU 2. The CPU 2 has a memory manager (not shown). The memory manager controls memories For reading and writing.

Next, a processing flow of the event driving simulation by the order deciding module 23 shown in FIG. 2 will be described with reference to FIGS. 5 and 6.

Figure 5:
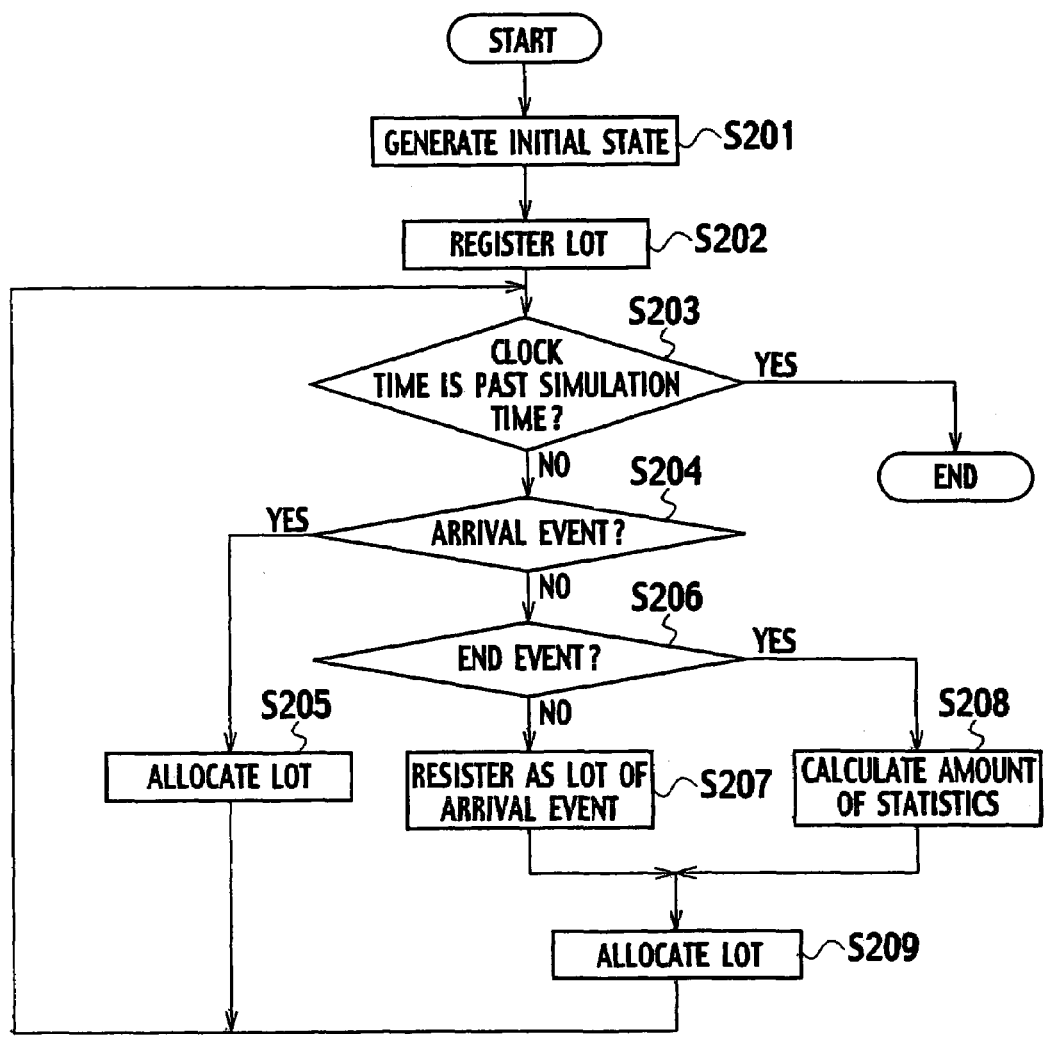
FIG. 5 is a flow chart showing an example of a method of scheduling according to the embodiment of the present invention.

In a step S201 of FIG. 5, the initial state generating unit 230a creates an initial state of the job shop that is prestored in the request storing file 61, based on the lot data obtained by the request obtaining module 21 shown in FIG. 1. In a step S202, the lot registering unit 230b shown in FIG. 2 registers lots obtained by the request obtaining module 21 shown in FIG. 1 and scheduled to arrive from the outside.

In a step S203, the clock time updating unit 230c shown in FIG. 2 advances a clock time to an earliest occurrence time of the event list, and determines whether the clock time is within the simulation end time or not. If the clock time is past the simulation end time, processing such as totaling statistics obtained for the lots or creating a Gantt chart is carried out to finish the simulation. On the other hand, if the time clock is not past the simulation end time, the process moves to a step S204.

If the event which is an object is an arrived event in the step S204, the data of the event is stored in the main memory 11, and then the data is deleted from the event list to proceed to a step S205. In the step S205, the state changing unit 230d shown in FIG. 2 registers the arrived lot in the queuing list of the corresponding EB lithography system. Here, if the EB lithography system is in an idle state, the lot alone is registered in the queuing list. Accordingly, the lot is allocated to the EB lithography system. Further, a work time is added to the clock time, and registered as an end event occurrence time in the event list. On the other hand, if the EB lithography system is not in the idle state, the length of the queue is increased by one by the arrival. In any case, the process returns to the step S203.

On the other hand, if an arrived event is not detected but an end event is determined in the step S204, data of the event is stored in the main memory 11, and then the data of the event is deleted from the event list to proceed to a step S206.

In the step S206, determination is made as to whether the end event is the last work process of the lot or not. If the end event is the last work of the lot, statistics, such as a production lead time or delivery delay, is calculated in a step S208. If the end event is not the last work of the lot in the step S206, a carrying time is added to the clock time, and it is reregistered as an arrived event occurrence time at the EB lithography system in which the next work is carried out in the event list in a step S207.

In a step S209, determination is made as to whether there is a queue or not in the EB lithography system in which work has been finished. If there is a queue, the rule determining unit 231 determines a scheduling rule. Further, the order deciding unit 230 applies a dispatching rule to select one lot, and allocates the selected lot to the EB lithography system. If there is only one lot in the queue, this lot is automatically allocated. In these cases, the data of the allocated lot is deleted from the queuing list. On the other hand, if the queue is in a state of 0, the work-finished EB lithography system is set to an idle state. Upon the end of the processing which accompanies the occurrence of the end event, the process returns to the step S203. By repeating the extraction/allocation of lots in the queue, it is possible to decide an order of processing a plurality of lots.

Next, an example of the EB lithography method which uses the EB lithography system shown in FIG. 1 will be described by referring to a flowchart of FIG. 6. It is to be noted that processing results of the CPU 2 shown in FIG. 1 are sequentially stored in the main memory 11. Additionally, it is to be noted that, for example, the time designation rule of the preparation rule, the priority designation rule of the fixed rule, and the minimum slack rule of the dynamic rule are stored in the scheduling rule storing file 63.

Figure 6:
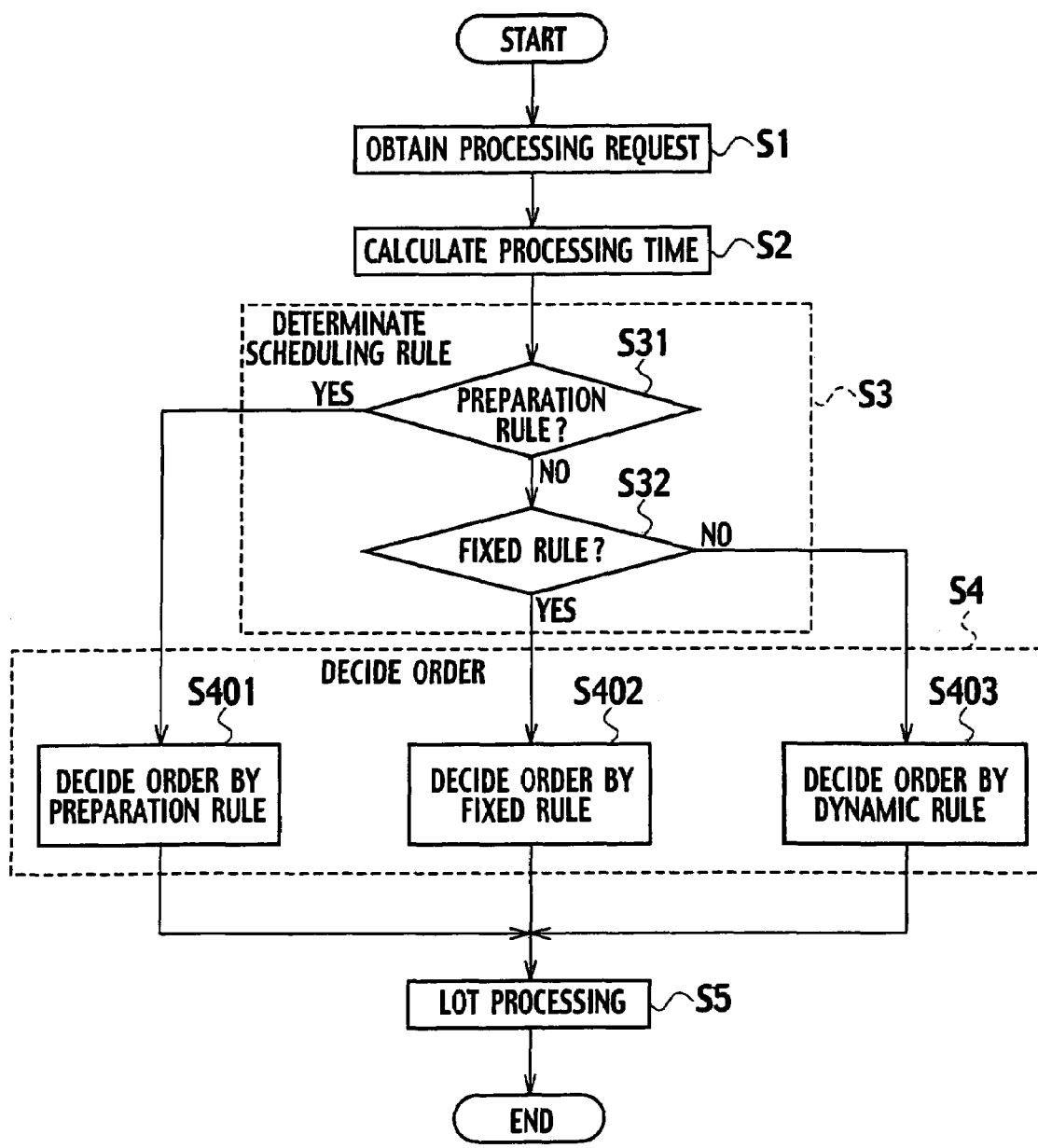
FIG. 6 is a flow chart for explaining a method of EB lithography according to the embodiment of the present invention.

In a step S1 shown in FIG. 6, the data converter 4 shown in FIG. 1 converts the design data stored in the design data memory 10 into lithography data. Further, the data converter 4 extracts, from among pieces of aperture information stored in the aperture information memory 3, aperture information regarding an optimal CP aperture for each lithography data when writing is conducted using the lithography data. The lithography data is stored together with the extracted aperture information in the lithography data memory 5. The request obtaining module 21 shown in FIG. 1 obtains a processing request of a plurality of lots through the input unit 7. The lot is a collection of semiconductor wafers processed by the lithography tool 92 within a fixed period. The obtained lot processing request is stored in the request storing file 61. It is assumed that the lots alone obtained by the request obtaining module 21 at this point of time are considered as targets of scheduling, and no lots arrive from the outside.

In a step S2, the processing time calculating module 22 reads the processing request of each lot stored in the request storing file 61, and a processing time necessary for processing the lot by using a CP aperture corresponding to the lot based on the lithography data stored in the lithography data memory 5 and the processing procedures of a plurality of lots stored in the processing procedure storing file 62.

In a step S31, the rule determining unit 231 shown in FIG. 2 reads the scheduling rule stored in the scheduling rule storing file 63 shown in FIG. 1, and determines whether it is a time designation rule or not. If the time designation rule is determined, the process proceeds to a step S401. If the time designation rule is not determined, the process proceeds to a step S32. In the step S32, the rule determining unit 231 shown in FIG. 2 determines whether the scheduling rule is a priority designation rule or not. If the priority designation rule is determined, the process proceeds to a step S402. If the priority designation rule is not determined, the scheduling rule is a minimum slack rule, and the process proceeds to a step S403.

In the step S401, the event driving type simulation procedure shown in FIG. 5 is carried out. The preparation rule deciding unit 232 shown in FIG. 2 decides an order of processing the plurality of lots to prevent overlapping of each lot processing with the schedule time based on the schedule time stored in the management parameter storing file 65 shown in FIG. 1. Additionally, in the step S402, the event driving type simulation shown in FIG. 5 is carried out, and the fixed rule deciding unit 233 shown in FIG. 2 decides an order of processing the plurality of lots in accordance with the order of priority based on the priority given in the processing procedures stored in the processing procedure storing file 62 shown in FIG. 1. On the other hand, in the step S403, the event driving type simulation shown in FIG. 5 is carried out, and the dynamic rule deciding unit 239 or the like decides an order of processing by giving priority to a lot of a minimum slack until delivery, based on the delivery time in the lot information. The order of processing decided in the steps S401 to S403 may be stored in the order storing file 66 shown in FIG. 1 or displayed on the screen or printed by using the output unit 8.

In a step S5, the lithography control module 24 shown in FIG. 1 outputs a control signal to the aperture manager 91 and the lithography tool 92 shown in FIG. 1 in accordance with the order of processing the plurality of lots decided in the steps S401 to S403. Based on the control signal output from the lithography control module 24, the aperture manager 91 and the lithography tool 92 write a plurality of character patterns of the CP apertures collectively onto the semiconductor wafer by the direct writing system, thereby sequentially processing the plurality of lots.

As described above, according to the embodiment of the invention, it is possible to automatically manage the order of processing for the plurality of lots requested to be processed by considering the change time of the CP apertures or the beam adjusting time. Thus, it is possible to efficiently process a plurality of lots.

Furthermore, the preparation rule deciding unit 232 shown in FIG. 2 allocates the processing of lots which can be processed before the start time of the schedule time in accordance with the time designation rule. Accordingly, it is possible to increase the number of lots to be processed before the schedule time. According to the fixed rule deciding unit 233, high priority is given in accordance with the processing priority rule, even when a processing request of a new lot accidentally interferes. Thus, the new lot can be processed first.

The procedures shown in FIG. 6 can be executed by control the CPU 2 by a program (EB system control program) which algorisms thereof equal to the procedures. The program includes: instructions for obtaining a processing requests for each of a plurality of lots; instructions for calculating corresponding processing times of each of the lots, using a plurality of apertures, based on corresponding processing procedures defined for each of plurality of the lots; instructions for deciding an order of processing the plurality of lots based on the processing times; and instructions for processing (writing patterns onto a plurality of substrates, which are classified into a plurality of the lots, respectively, using sequentially CP apertures through which EB, based on the order). The program may be stored in the main memory 11 and the like of the EB lithography system shown in FIG. 1. The program can be stored in a computer-readable storage medium. The procedures of the method of generating mask data can be performed, by reading the program from the computer-readable storage medium to the main memory 11.

Here, the "computer-readable storage medium" means any media and the like that can store a program, including, e.g., external memory units, semiconductor memories, magnetic disks, optical disks, magneto-optical disks, magnetic tape, and the like for a computer. To be more specific, the "computer-readable storage media" include flexible disks, CD-ROMs, MO disks, cassette tape, open reel tape, and the like. For example, the main body of the mask data generation system can be configured to incorporate a flexible disk drive and an optical disk drive, or to be externally connected thereto. A flexible disk is inserted into the flexible disk drive from a slot, a CD-ROM is inserted into the optical disk drive from a slot, and then a given readout operation is executed, whereby programs stored in these storage media can be installed on the main memory 11. In addition, by connecting given drives to the mask data generation system, it is also possible to use, for example, a ROM as a memory unit employed for a game pack or the like, and cassette tape as magnetic tape. Furthermore, it is possible to store a program in another program storage device via an information processing network, such as the Internet.

Next, an example of performing an event driving type simulation will be described by using a specific model of a backend process of a chip manufacturing process shown in FIG. 7. Model targets are a newly input lot, a rearrived lot, an EB lithography system, a CP aperture, and a character pattern. It is a hole process and a wiring process that are treated outside. In a step S61, a lot is input. In a step S62, EB lithography processing is carried out for a wafer of the lot by using the lithography tool 92 of the EB lithography system shown in FIG. 1. In a step S631, one of a wiring process A, a hole process A, a wiring process B and a hole process B is determined as a next step. In steps S632 to S635, the wiring process A, the hole process A, the wiring process B and the hole process B are executed for the lot in which the EB lithography processing has been finished. In a step S64, a lot the wiring/hole process has been finished is input again, and EB lithography processing of a next layer is carried out.

Figure 7:
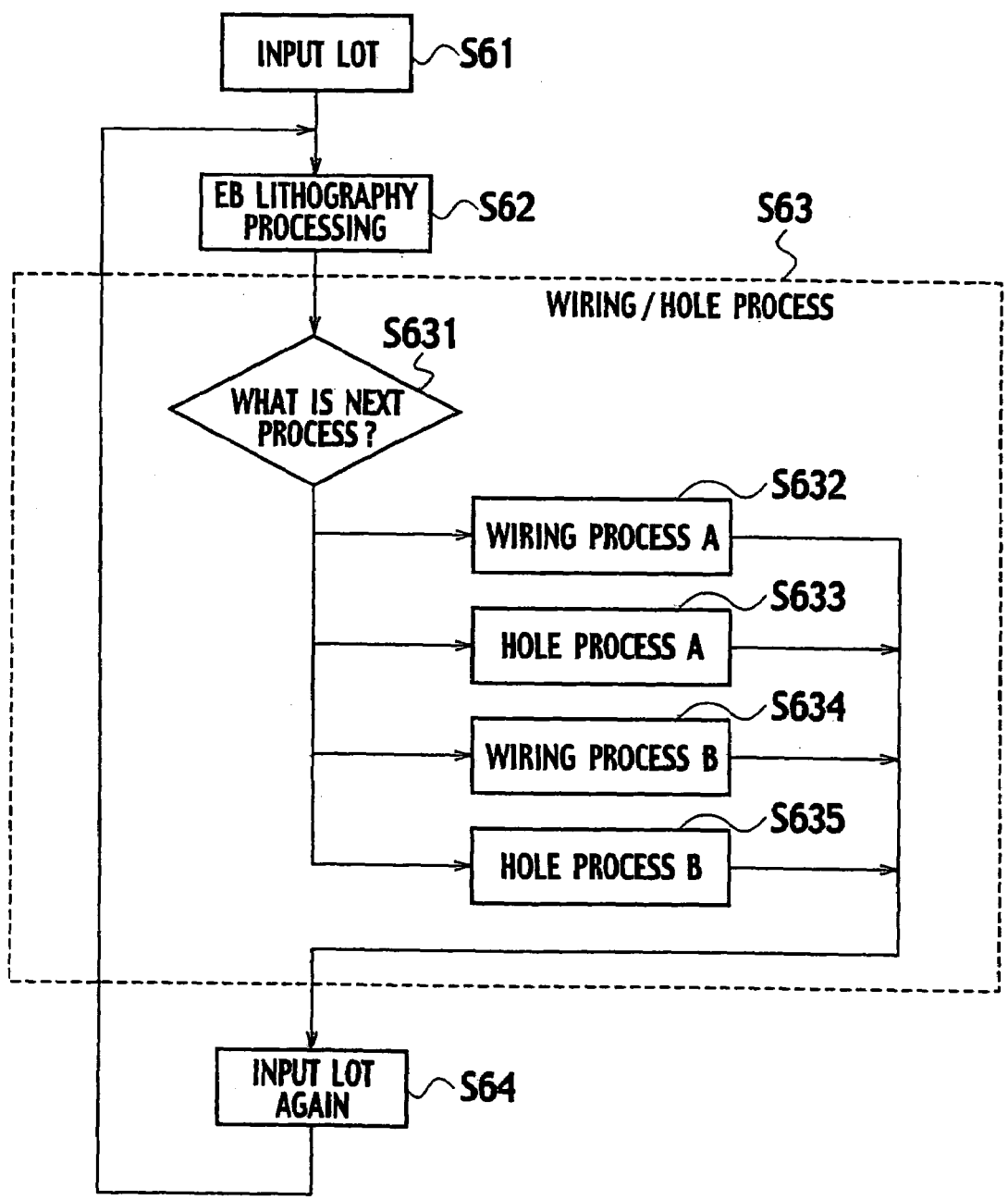
FIG. 7 is a flow chart showing an example of model using event driven type simulation according to the embodiment of the present invention.

The model shown in FIG. 7 is applied in a schedule method of the embodiment. For example, as shown in FIG. 8, ten kinds of products (product names: A to J) are set. Product names of lots A, B, C, . . . , J, numbers of wiring layers 8, 5, 8, . . . , 7 corresponding to the product names A, B, C, . . . , J, corresponding CP information 3, 2, 3, . . . , 2, numbers of chips 200, 300, 400, . . . , 300 per wafer, numbers of lots 3, 2, 3, . . . 0.2 needed to be processed per day, and the like are included. Three digits in the section of the layer breakdown indicate a local wiring, a semiglobal wiring, and a global wiring from the left. Each product has a structure of four to eight layers in the backend process. Each product uses any one of the registered CP apertures, and some products may use CP apertures of the same kind. For example, lot delivery time is seven days.

For processing procedures of the lots of the product names A to J, for example, as shown in FIG. 9, a processing layer, information of an optimal kind of CP apertures/character patterns, and number of shots per chip are written. In the section of the processing layer, "M1" to "M8" indicate wiring layers, and "V1" to "V7" indicate vias. For the lots, there are via layers for holes among the wiring layers (four to eight layers). In the section of the information of the optimal aperture kinds/character patterns, "A1" to "A4" indicate kinds of apertures, and "CP"1 to "CP9" indicate kinds of character patterns. In the section of the shot number, for example, one shot is 500 ns.

As aperture information, the number of spare CP apertures, a change time (20 min.) of the CP aperture, a maintenance frequency (executed for 5000 wafers for each processing), and CP aperture maintenance time (1 day) are set. For the character patterns, the number and kinds of character patterns mounted on one CP aperture, and a beam adjusting time (number of character patterns×5 min.) before lithography are set. For the EB lithography system, characteristics (writing accuracy, lithography speed), a device maintenance frequency (4 hours/week), and a wafer carrying time (5 min.) of each EB lithography system are set.

As the dispatching rule, for example, the FIFO rule, the minimum aperture changing rule, the reinput lot prediction rule, and the shop first-come first-served rule are selected, and linearly combined. In the minimum aperture changing rule, priority is given to lots which use the same kind of apertures, and thus lots which do not have frequent common processes are processed later. In the reinput lot prediction rule, rearrival times ahead of two or three layers cannot be predicted. In the shop first-come first-served rule, if a lot returns from another step, the lot takes priority over a new lot.

Figure 10:
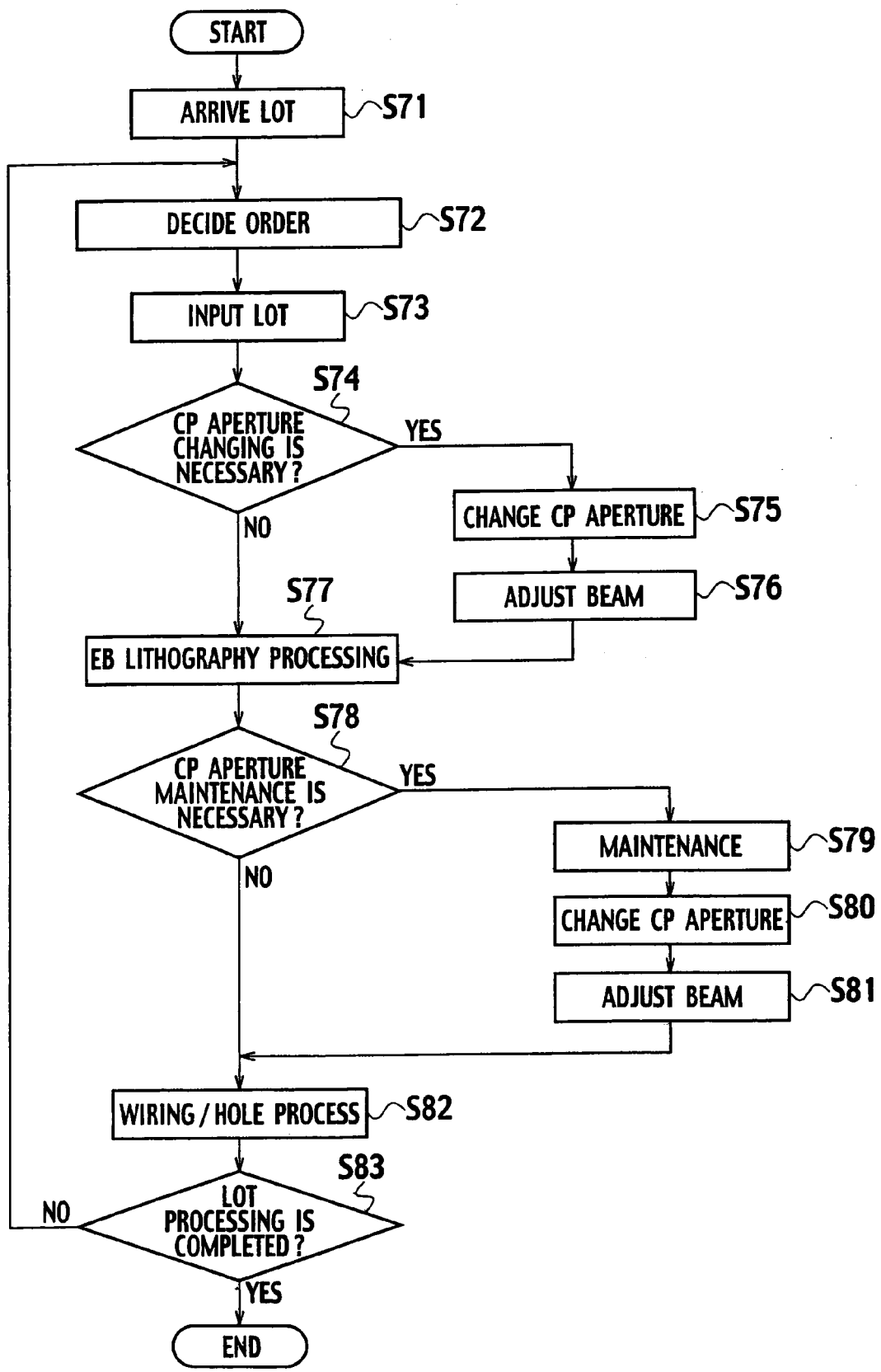
FIG. 10 is a flow chart showing an example of event driven type simulation according to the embodiment of the present invention.

As the event list, as shown in FIG. 10, lot arrival, beam adjustment, EB lithography processing, CP aperture changing, maintenance of CP apertures, beam adjustment and the like are set.

In a step S71, new lots arrive, and the request obtaining module 21 shown in FIG. 1 obtains data of the lots. The new lots arrive randomly for each product. The processing time calculating module 22 calculates processing time of the obtained lots. In a step S72, the order deciding module 23 decides an order of processing in accordance with the scheduling rule. In a step S73, the lots are input to the EB lithography system based on the decided order of processing. In a step S74, immediately before EB lithography processing, determination is made as to matching between the lot to be written next and a CP aperture. If the CP aperture matches, the process proceeds to a step S77. On the other hand, if the CP aperture does not match, the process proceeds to a step S75 to change the CP aperture. Proceeding to a step S76, beam adjusting accompanying the CP aperture changing is executed, and the process proceeds to a step S77. By the EB lithography processing, a character pattern of the CP aperture is written on the lot wafer. Upon the end of EB lithography processing for layers equivalent to the number of wafers per lot, the process proceeds to a step S78.

In the step S78, determination is made as to whether CP aperture maintenance is necessary or not. If the maintenance is not necessary, the process proceeds to a step S82. On the other hand, if the maintenance is necessary, the process proceeds to a step S79 to execute maintenance. Proceeding to a step S80, aperture changing is carried out to match a lot to be processed next. In a step S81, beam adjusting is executed, and the process proceeds to a step S82. The lot in which EB lithography processing has been finished is advanced to the wiring/hole process, and one of the wiring and hole processes is carried out. In a step S83, the lot with an unfinished last step returns to the step S71 after several hours, and arrives at the EB lithography system. On the other hand, if the last step of the lot is finished in the step S83, the backend process is completed.

Figure 11:
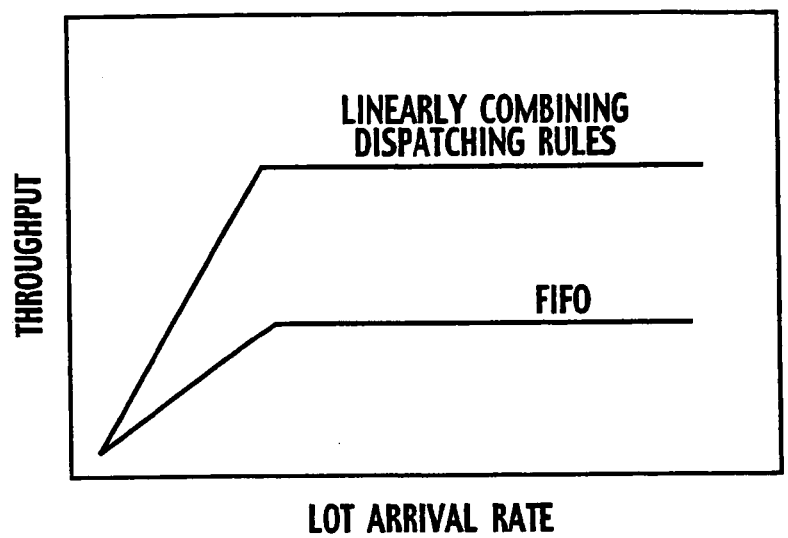
FIG. 11 is a graph showing a relation between lot arrival rate and throughput according to the embodiment of the present invention.
Figure 12:
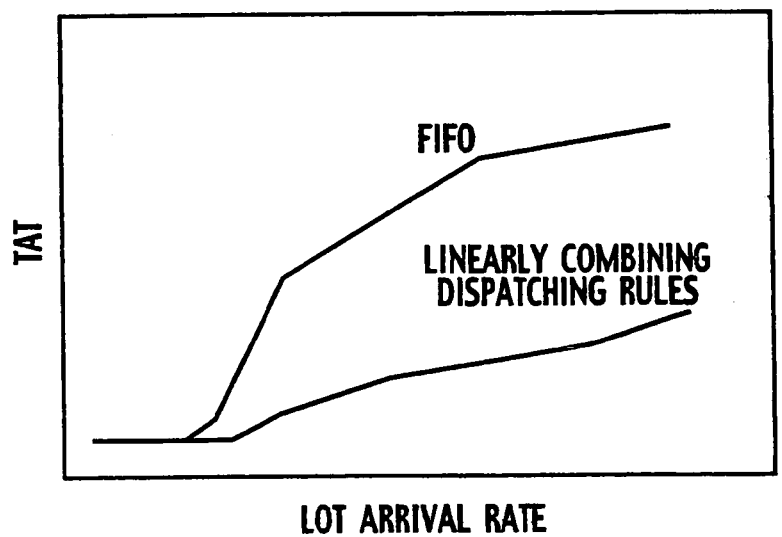
FIG. 12 is a graph showing a relation between lot arrival rate and turn around time according to the embodiment of the present invention.

According to the EB lithography system shown in FIG. 1, the scheduling can be carried out by performing the aforementioned event driving type simulation, and the lot processing throughput can be improved. As a result of performing the scheduling by linearly combining the scheduling rules, evaluation indexes such as average delivery delay, average delivery time shifting, a delivery delay occurrence rate, average delivery delay with conditions, maximum delivery delay, an average production lead time (average shop time) and a total processing time have been improved compared to the case of deciding the order of processing based on the FIFO rule alone. It is to be noted that the total processing time is a time from the start of work of at least one lot to the completion of all the lots, and usually a static evaluation yardstick of scheduling problems. As an example, FIG. 11 shows a relation between a lot arrival rate and throughput, and FIG. 12 shows a relation between a lot arrival rate and a turnaround time (TAT). It can be understood that as compared with the FIFO rule alone in which the processing is executed in accordance of an input order, throughput is at least doubled, and the TAT is decreased by at least ½.

Next, a description will be made regarding a method for manufacturing a semiconductor device (a large-scale integrated circuit LSI) by use of the electron beam drawing tool shown in FIG. 1, with reference to FIG. 13.

The method for manufacturing a semiconductor device with directly writing includes: generating layout data of device patterns of a plurality of lots in step S100 (design process); converting the layout data of each of the lots into lithography data by the data converter 4 shown in FIG. 1 in step S101; obtaining a processing requests for the lots by the request obtaining module 21 in step S102; calculating processing times for each of the lots using the CP apertures based on processing procedures of the plurality of lots by the processing time calculating module 22 in step S103; deciding an order of processing of the lots based on the processing times by the order deciding module 23 in step S104; and writing the device patterns onto semiconductor wafers in each of the lots, respectively, using the apertures by the lithography data and the order of processing by the lithography tool 92 in step S300 (chip manufacturing process). Now, a description will be given below regarding the details of the respective processes.

Figure 13:
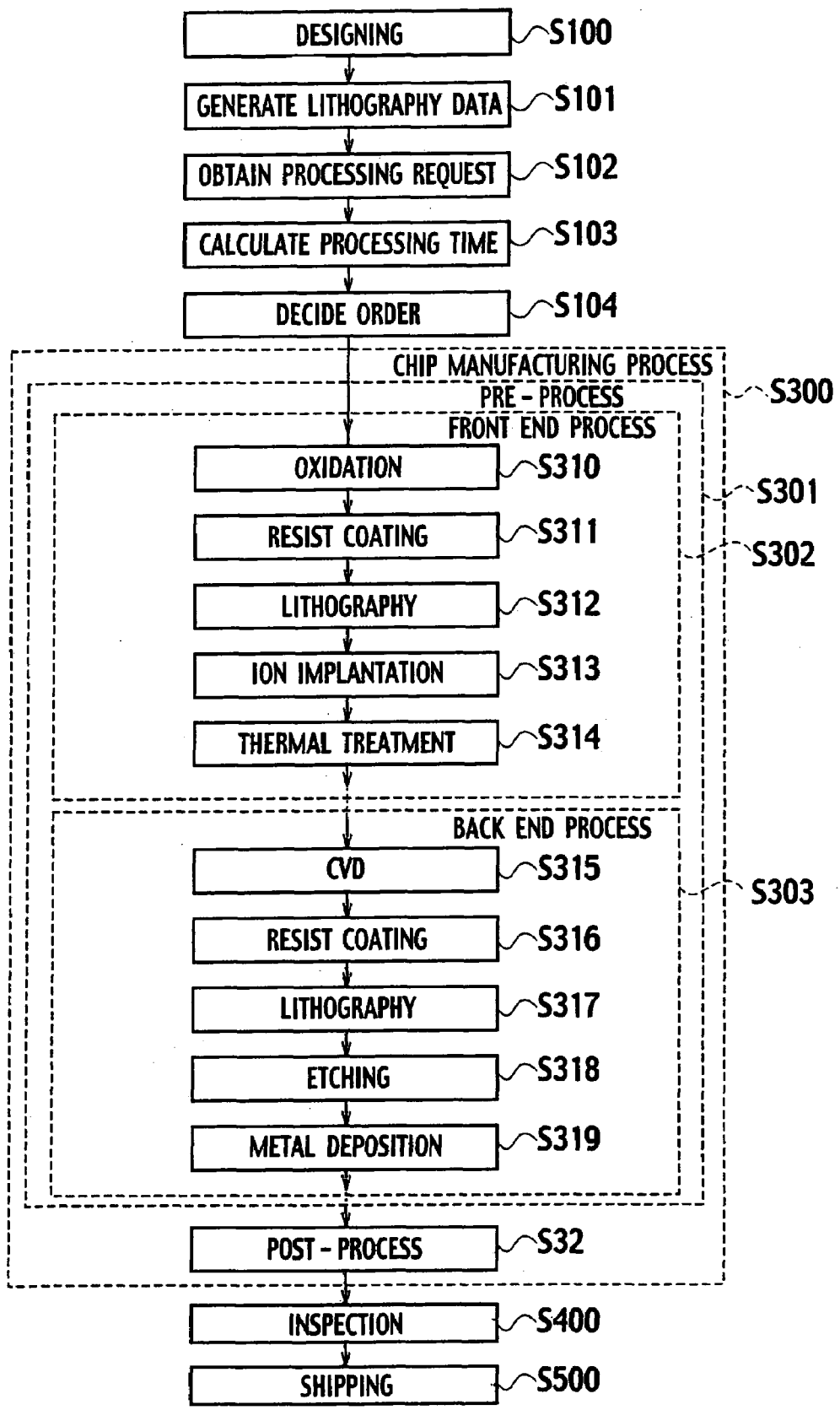
FIG. 13 is a flow chart for explaining a method for manufacturing a semiconductor device according to the embodiment of the present invention.

First, process mask simulation is carried out in Step S100 shown in FIG. 13. Device simulation is performed by use of a result of the process mask simulation and each value of currents and voltages to be input to each of the electrodes is set. Circuit simulation of the LSI is performed based on electrical properties obtained by the device simulation. Accordingly, layout data of device patterns is generated for each layer of the device layers corresponding to each stage in a manufacturing process.

In step S101, pattern data of mask (drawing mask data) corresponding to each of the layers of a semiconductor chip is determined, using a CAD system based on patterns such as a layout designed in the design process in step S100. In step S102, the request obtaining module 21 obtains a processing requests of a plurality of lots having semiconductor wafers to be delineated with device patterns. In step S103, the processing time calculating module 22 calculates processing times of the plurality of lots using CP aperture based on the processing procedure regarding the plurality of lots obtained in step S102 and stored in the processing procedure storing file 62. In step S104, the order deciding module 23 decides an order of processing the plurality of lots with CP aperture changing and beam adjustment, if needed, based on the processing times calculated in step S103.

Next, a series of processes including an oxidation process in Step S310, a resist coating process in Step S311, the photolithography process with directly writing in Step S312, an ion implantation process in Step S313, a thermal treatment process in Step S314, and the like are repeatedly performed in a front-end process (substrate process) in Step 302 for the plurality of lots. In step S313, a resist film (a photo resist film) is spin-coated on a semiconductor wafer. In step S312, the character patterns of CP aperture are written collectively on a photo resist of each wafers with directly writing, based on the order of processing decided in step S103 and the lithography data generated by the lithography tool 92 shown in FIG. 1 instep S101. The photo resist is developed, and thereby etching masks made of resist film are delineated by exposing device patterns of one of the masks in the set of masks. In step S313, the semiconductor wafer is processed using the etching masks delineated in step S312. When the above-described series of processes are completed, the procedure advances to Step S303.

Next, a back-end process (surface wiring process) for wiring the substrate surface is performed in Step S303. A series of processes including a chemical vapor deposition (CVD) process in Step S315, a resist coating process in Step S316, the photolithography process in Step S317, an etching process in Step 318, a metal deposition process in Step 319, and the like are repeatedly performed in the back-end process. In Step S317 which is similar to step S312, the character patterns of the CP aperture are written collectively on a photo resist of each wafers with directly writing, based on the order of processing decided in step S103 and the lithography data generated by the lithography tool 92 shown in FIG. 1 in step S101. The photo resist is developed, and thereby etching masks made of resist film are delineated by exposing device patterns of one mask in the set of masks. When the above-described series of processes are completed, the procedure advances to Step S304.

When a multilayer wiring structure is completed and the pre-process is finished, the substrate is diced into chips of a given size by a dicing machine such as a diamond blade in Step S304. The chip is then mounted on a packaging material made of metal, ceramic or the like. After electrode pads on the chip and leads on a leadframe are connected to one another, a desired package assembly process such as plastic molding is performed.

In Step S400, the semiconductor device is completed after an inspection of properties relating to performance and function of the semiconductor device, and other given inspections on lead shapes, dimensional conditions, a reliability test, and the like. In Step S500, the semiconductor device which has cleared the above-described processes is packaged to be protected against moisture, static electricity and the like, and is then shipped out.

According to the method for manufacturing a semiconductor device by directly writing, in steps S312 and 317, the EB lithography system shown in FIG. 1 directly write on wafers in a plurality of lot by considering CP aperture changing time and beam adjusting time, and by managing the order of processing the plurality of lots. Therefore, it is possible to improve throughput for processing a plurality of lots.

(First Modification)

Figure 14:
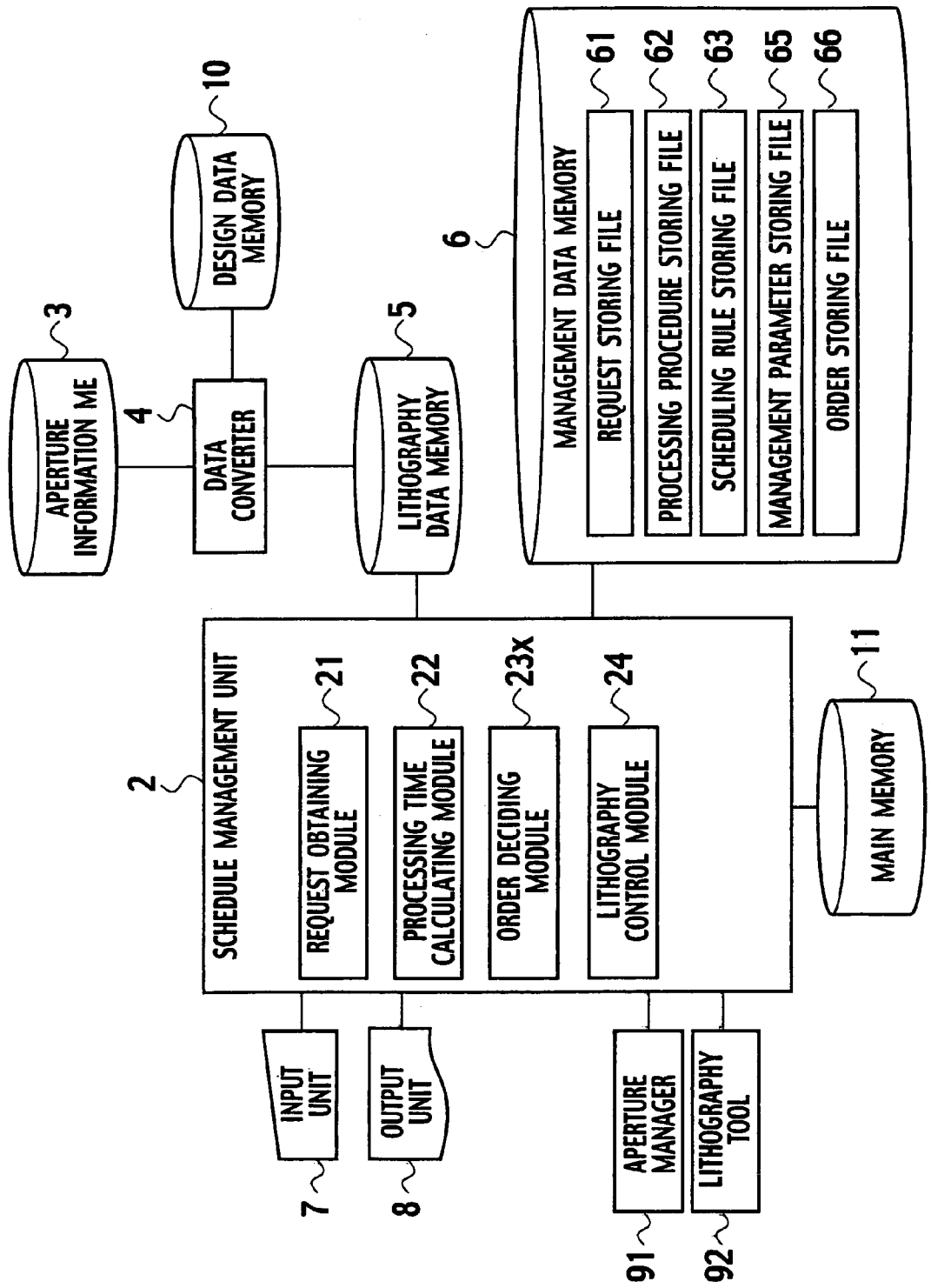
FIG. 14 a block diagram of EB lithography system according to the first modification of the present invention.

An EB lithography system according to a first modified example of the embodiment of the present invention is, as shown in FIG. 14, different in that the order deciding module 23 shown in FIG. 1 is changed to an order deciding module 23*x*. A scheduling rule storing file 63 stores, as scheduling rules, in addition to a preparation rule, a fixed rule and a dynamic rule, a parameter designation rule for deciding priority based on parameters regarding lots, and a lithography data changing rule for changing lithography rule used to avoid CP aperture changing. The parameter designation rule includes a lithography condition designation rule, a writing accuracy designation rule, and an aperture designation rule.

Figure 15:
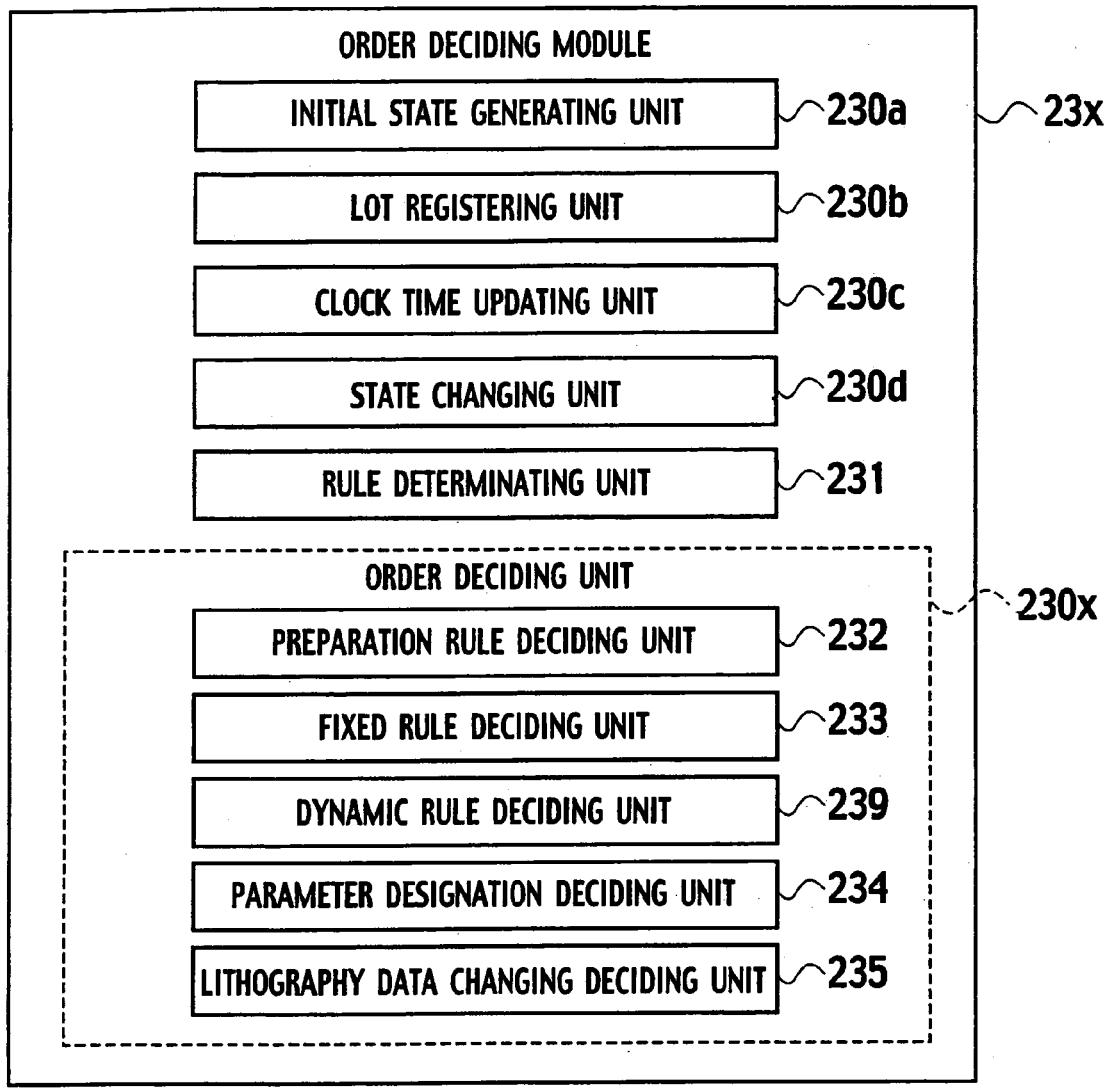
FIG. 15 a block diagram of an order deciding module according to the first modification of the present invention.
Figure 16:
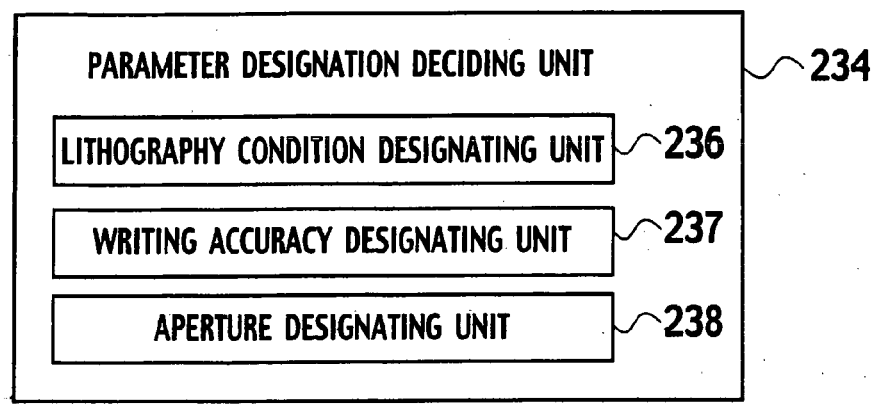
FIG. 16 a block diagram of a parameter designation deciding unit according to the first modification of the present invention.

As shown in FIG. 15, the order deciding module 23x is different from the order deciding module 23 including the order deciding unit 230 shown in FIG. 2 in that it further includes a parameter designation deciding unit 234 and a lithography data changing deciding unit 235. If a scheduling rule is determined to be a parameter designation rule by the rule determining unit 231, the parameter designation deciding unit 234 decides an order of processing based on parameters contained in the order stored in the processing procedure storing file 62 shown in FIG. 14. As shown in FIG. 16, the parameter designation deciding unit 234 includes a lithography condition designating unit 236, a writing accuracy designating unit 237, and an aperture designating unit 238.

Figure 17:
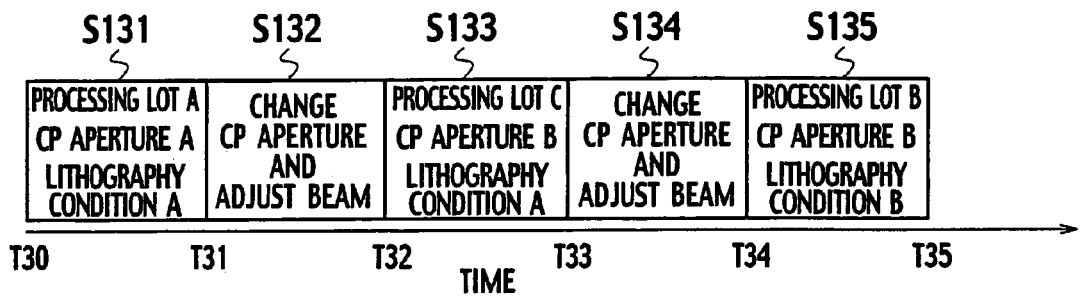
FIGS. 17 to 20 are timing charts showing examples of schedules according to the first modification of the present invention.

When the scheduling rule is determined to be a lithography condition designation rule by the rule determining unit 231, the lithography condition designating unit 236 decides a continuous order of processing for lots of the same lithography conditions if there are lots in which the lithography conditions contained in the processing procedures stored in the processing procedure storing file 62 shown in FIG. 14 are the same. For example, as shown in FIG. 17, the lithography condition designating unit 236 allocates processing of a lot A of a lithography condition A of a step S131 to times T30 to T31, CP aperture changing and beam adjusting of a step S132 to times T31 to T32, processing of a lot C of the same lithography condition A of a step S133 to times T32 to T33. Further, if there is no lot of the lithography condition A, the lithography condition designating unit 236 allocates CP aperture changing and beam adjusting of a step S134 to times T33 to T34, and processing of a lot B of a lithography condition B different from the lithography conditions of a step S135 to times T34 to T35.

Figure 18:
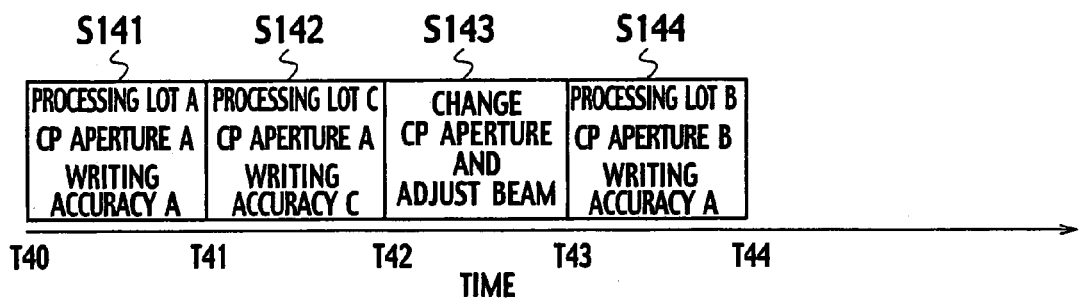

When the scheduling rule is determined to be a writing accuracy designation rule by the rule determining unit 231, the writing accuracy designating unit 237 shown in FIG. 16 allocates processing to a lot in which low writing accuracy is permitted after processing of a lot in which high writing accuracy is required, based on the writing accuracy of the lithography tool 92 stored in the management parameter storing file 65 shown in FIG. 14 and writing accuracy necessary for corresponding lots contained in the processing procedures stored in the processing procedure storing file 62. For example, as shown in FIG. 18, the writing accuracy designating unit 237 sets the writing accuracy in descending order as writing accuracy A, writing accuracy B, writing accuracy C, . . . , and allocates processing of the lot A needing high writing accuracy A of a step S141 to times T40 to T41, and the lot C not needing beam adjustment of a step S142 to times T41 to T42. Further, the writing accuracy designating unit 237 allocates CP aperture changing and beam adjusting of a step S143 to times T42 to T43, and processing of the lot B needing high writing accuracy A of a step S144 to times T43 to T44.

Figure 19:
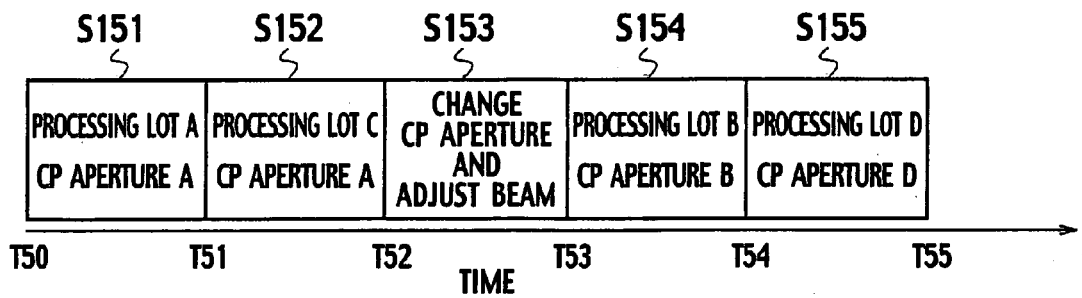

When the scheduling rule is determined to be an aperture designation rule by the rule determining unit 231, the aperture designating unit 238 continuously allocates lots which use the same CP aperture based on the kinds of CP apertures contained in the processing procedures stored in the processing procedure storing file 62 shown in FIG. 1. For example, as shown in FIG. 19, the aperture designating unit 238 allocates processing of the lot A using a CP aperture A of a step S151 to times T50 to T51, and the lot C using the same CP aperture A of a step S152 to times T51 to T52. Further, if there are no other lots using the CP aperture A, the aperture designating unit 238 allocates CP aperture changing and beam adjusting of a step S153 to times T52 to T53, T53 to T54, and T54 to T55, and processing of the lot B of a CP aperture B different from the CP aperture A of a step S154, and processing of a lot D of a CP aperture D of a step S155.

When the scheduling rule is a lithography data changing rule, the lithography data changing deciding unit 235 shown in FIG. 15 changes the lithography data stored in the lithography data memory 5 to decide an order of processing without changing the CP apertures. By using CP apertures optimal for the lots, processing can be carried out within the shortest lithography time. However, CP aperture changing and beam adjusting are necessary.

Figure 20:
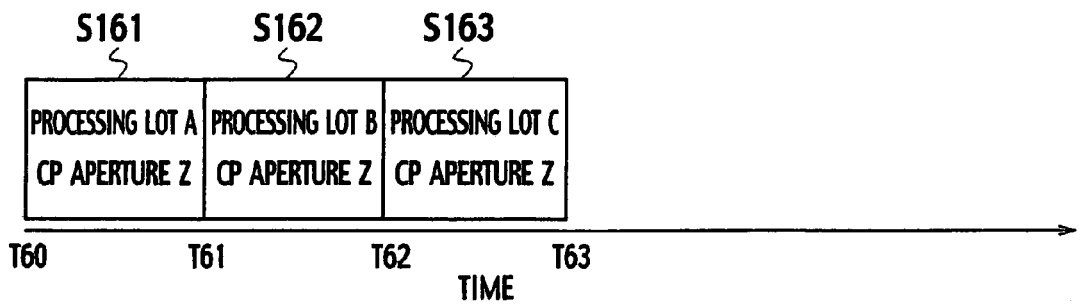

For example, processing times are respectively one hour, two hours and one hour when optimal CP apertures A, B and C are used for the lots A, B and C. One hour is necessary for each of CP aperture changing and beam adjusting, and thus a total processing time is six hours. On the other hand, the lithography data changing deciding unit 235 changes the lithography data so that, among a plurality of CP aperture candidates contained in the lithography data, including preceding and succeeding lots, the same CP aperture Z can be used to provide the shortest processing time. Further, as shown in FIG. 20, the lithography data changing unit 235 allocates processing of using the CP aperture Z for the lots A, B and C to times T60 to T61, T61 to T62, and T62 to T63. If the processing times of the lots A, B and C are respectively 1.25 hour, 2.25 hours, and 1.25 hour, a total processing time is 4.75 hours since CP changing and beam adjusting are unnecessary because of the use of the same CP aperture Z.

The lithography condition designating unit 236, the writing accuracy designating unit 237, the aperture designating unit 238 and the like of the parameter designation deciding unit 234 shown in FIG. 16 may be included in the preparation rule deciding unit 232 shown in FIG. 15 since the beam adjusting time and the aperture changing time are treated as preparation times.

Next, an EB lithography method according to the first modified example of the present invention will be described by referring to a flowchart of FIG. 21. It is assumed that the time designation rule of the preparation rule, the priority designation rule of the fixed rule, and the minimum slack rule of the dynamic rule, and the lithography condition designation rule, the writing accuracy designation rule and aperture designation rule of the parameter designation rule are stored in the scheduling rule storing file 63.

Figure 21:
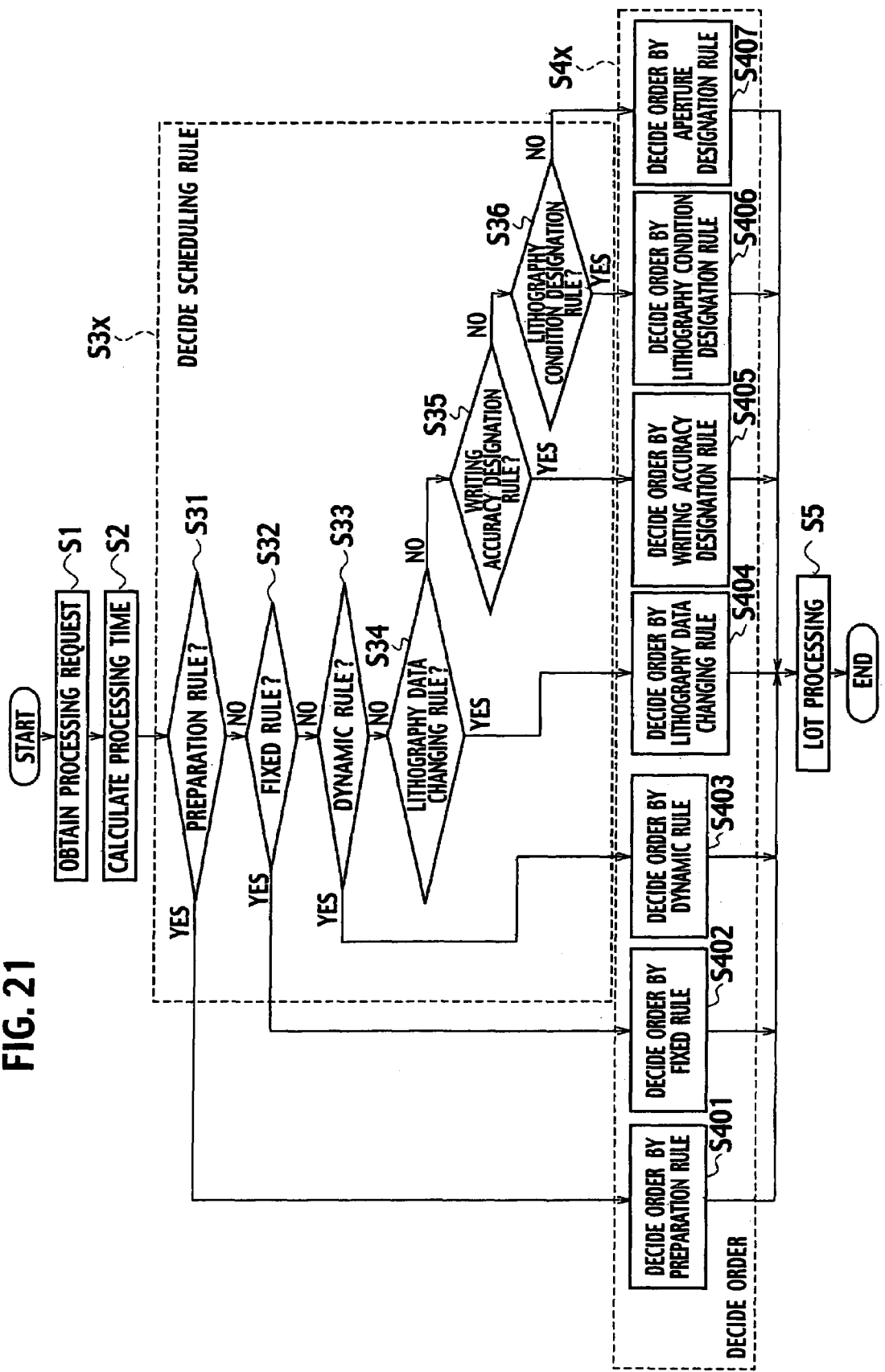
FIG. 21 is a flow chart for explaining a method of EB lithography according to the first modification of the present invention.

Steps S1 and S2 and S31 to S32 of FIG. 21 are similar to those of FIG. 6, and thus repeated explanation will be avoided. In a step S33, the rule determining unit 231 shown in FIG. 15 determines whether the scheduling rule is a minimum slack rule or not. If the minimum slack rule is determined, the process proceeds to a step S403. If the minimum slack rule is not determined, the process proceeds to a step S34. In the step S33, the rule determining unit 231 determines whether the scheduling rule is a lithography data changing rule or not. If the lithography changing rule is determined, the process proceeds to the step S403. If the lithography changing rule is not determined, the process proceeds to the step S34. In the step S34, the rule determining unit 231 determines whether the scheduling rule is a writing accuracy designation rule or not. If the writing accuracy designation rule is determined, the process proceeds to a step S404. If the writing accuracy rule is not determined, the process proceeds to a step S35. In the step S35, the rule determining unit 231 determines whether the scheduling rule is a lithography condition designation rule or not. If the lithography condition designation rule is determined, the process proceeds to a step S405. If the lithography condition designation rule is not determined, the scheduling rule is an aperture designation rule, and thus the process proceeds to a step S406.

The steps S401 to S403 are similar to those of FIG. 6, and thus repeated explanation will be avoided. In the step S404, the lithography data changing deciding unit 235 shown in FIG. 15 changes the lithography data stored in the lithography data memory 5 shown in FIG. 14 to decide an order of processing without changing CP apertures. In the step S405, the writing accuracy designation unit 237 shown in FIG. 16 allocates processing of a lot in which low writing accuracy is permitted after a lot needing high writing accuracy, based on the writing accuracy of the lithography tool 92 stored in the management parameter storing file 65 shown in FIG. 14 and writing accuracy necessary for corresponding lots contained in the processing procedures stored in the processing procedure storing file 62. In the step S406, if there are lots similar to each other in lithography conditions contained in the processing procedures stored in the processing procedure storing file 62, the lithography condition designating unit 236 continuously decides an order of processing for the lots of the same lithography conditions. In the step S407, if the scheduling rule is determined to be an "aperture designation rule" by the rule determining unit 231, the aperture designating unit 238 shown in FIG. 16 continuously allocates lots which use the same CP aperture based on the kinds of CP apertures contained in the processing procedures stored in the processing procedure storing file 62 shown in FIG. 14.

In a step S5, the lithography control module 24 shown in FIG. 14 outputs a control signal to the aperture manager 91 and the lithography tool 92 in accordance with the order of processing decided in any one of the steps S401 to S407 The aperture manager 91 and the lithography tool 92 execute processing of the lots by using the CP aperture based on the control signal output from the lithography control module 24.

As described above, according to the first modified example, as in the case of the embodiment, it is possible to automatically manage the order of processing for the lots requested to be processed, and to efficiently operate the EB lithography system even in the case of large-variety small volume manufacturing. According to the lithography designating unit 236 shown in FIG. 16, by continuously using the lithography conditions set for the lithography tool 92 shown in FIG. 14, it is possible to reduce the time of beam adjustment by changing the lithography conditions, and to shorten the total processing time. According to the writing accuracy designating unit 237 shown in FIG. 16, beam adjustment of processing of the lot C not needing high writing accuracy after the processing of the lot needing high writing accuracy processing is unnecessary. Thus, the beam adjustment time can be shortened. According to the aperture designating unit 238, CP aperture changing is unnecessary between the continuous lots, making it possible to shorten the total processing time. Moreover, according to the lithography data changing deciding unit 235 shown in FIG. 15, the time for CP aperture changing and beam adjusting is unnecessary, making it possible to shorten the total processing time.

(Second Modification)

Figure 22:
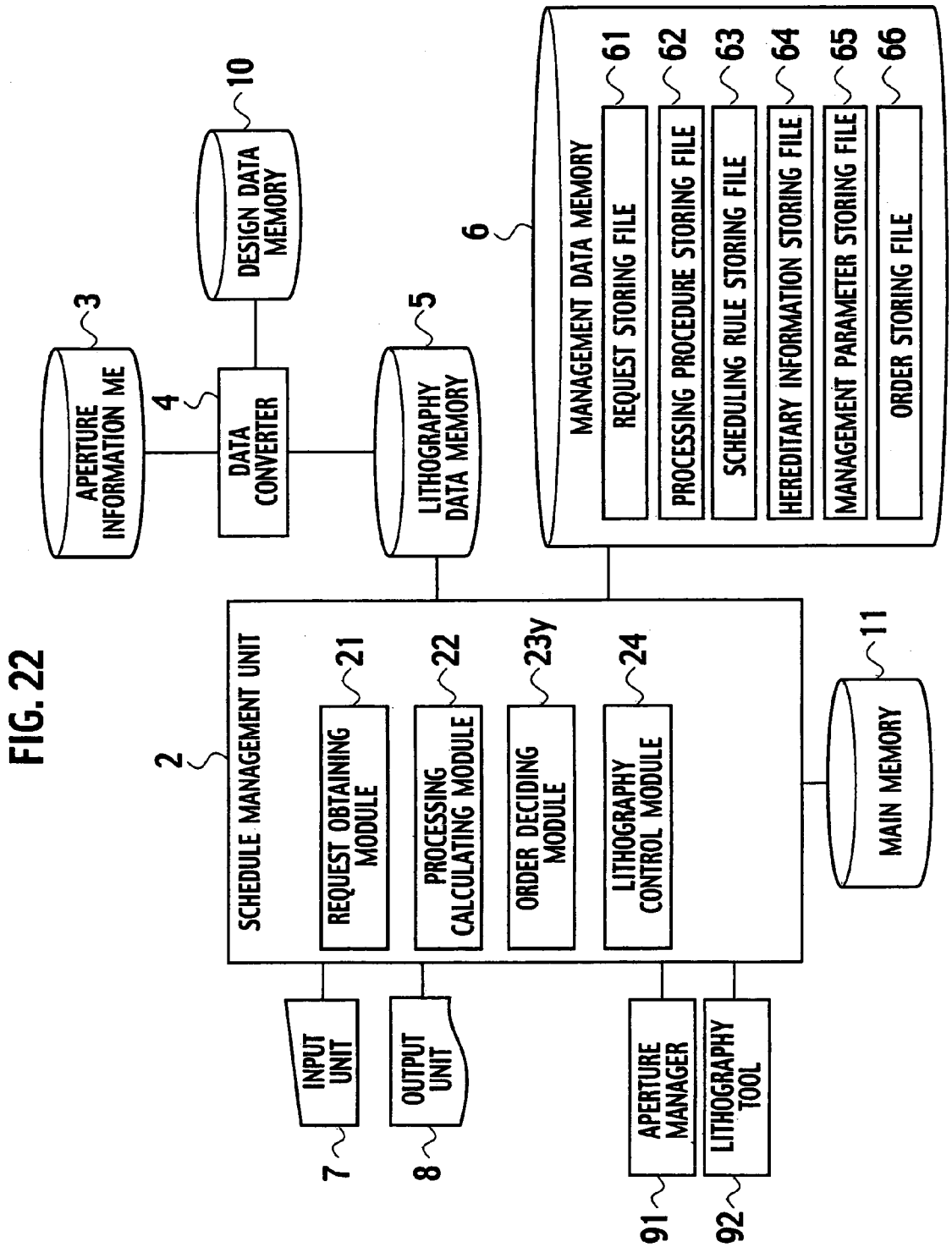
FIG. 22 is a block diagram of an EB lithography system according to the second modification of the present invention.

An EB lithography system according to a second modified example of the embodiment of the present invention is, as shown in. FIG. 22, different in that the management data memory 6 and the order deciding module 23 shown in FIG. 1 are respectively changed to a management data memory 6*y* and an order deciding module 23*y*. The management data memory 6*y* is different from the management data memory 6 shown in FIG. 1 in that it includes a hereditary information storing file 64. The hereditary information storing file 64 stores hereditary information necessary for performing hereditary algorithm processing, such as a multiplication rate, a mutation rate, a crossover rate, and the number of generations (hereditary algorithm processing will be detailed later). The scheduling rule storing file 63 stores, as scheduling rules, in addition to a preparation rule, a fixed rule, a dynamic rule, and a hereditary processing designation rule.

Figure 23:
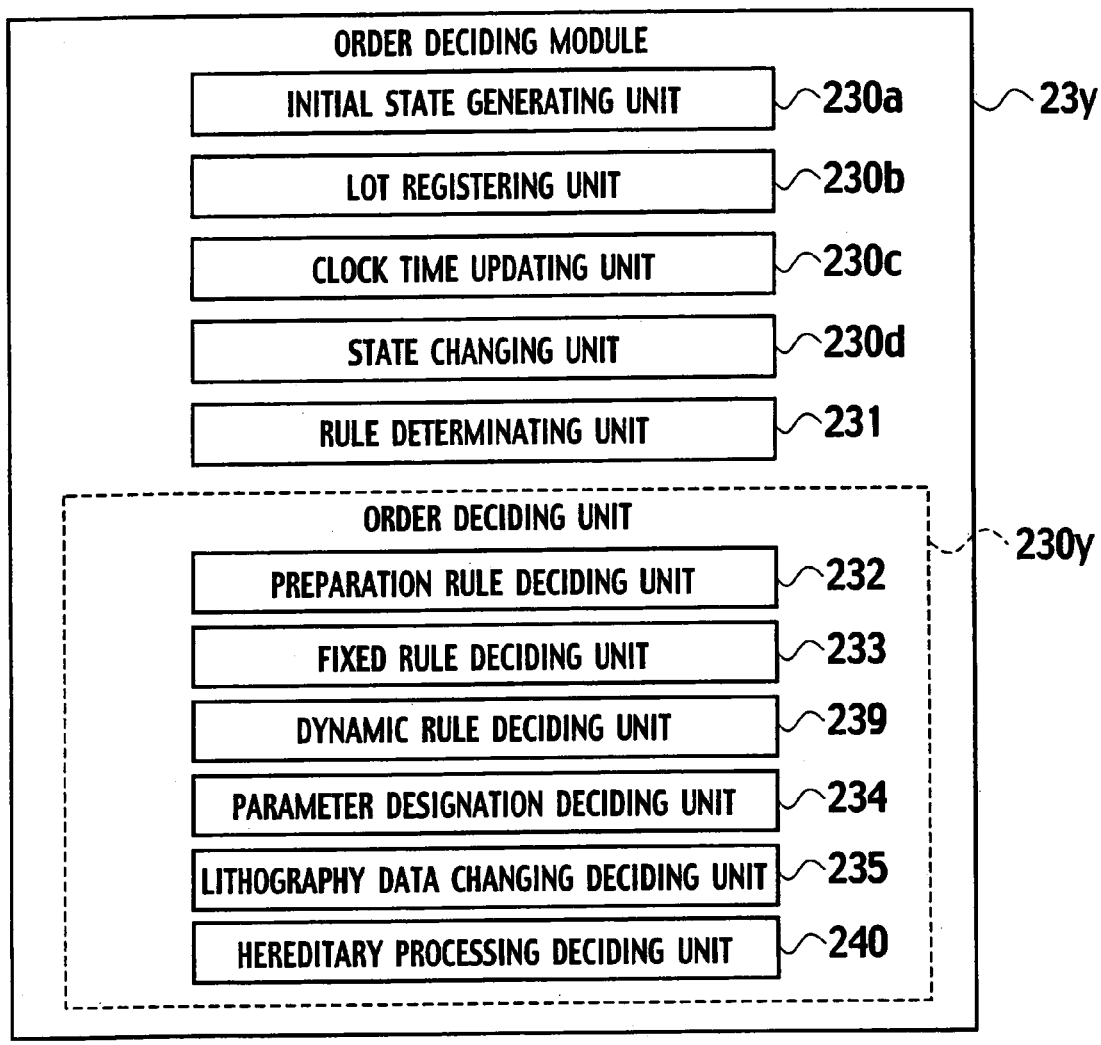
FIG. 23 is a block diagram of an order deciding module according to the second modification of the present invention.
Figure 24:
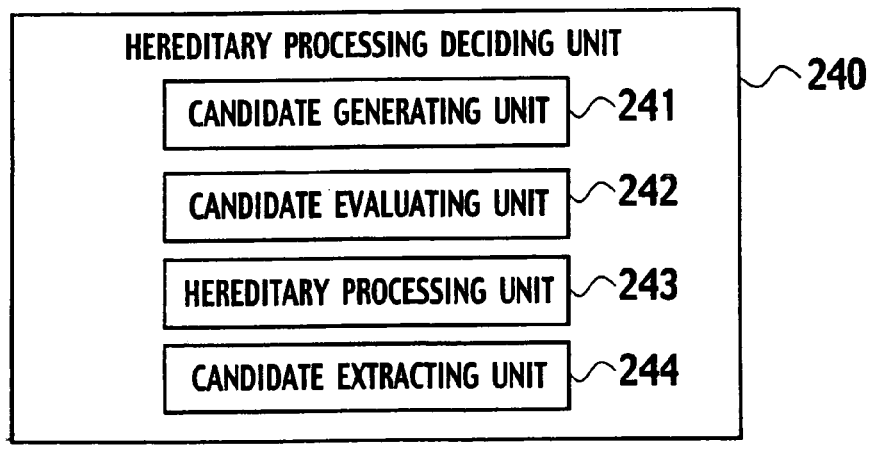
FIG. 24 is a block diagram of a hereditary processing deciding unit according to the second modification of the present invention.

As shown in FIG. 23, the order deciding module 23*y* is different from the order deciding module 23 shown in FIG. 2 in that it includes an order deciding unit 230*y*. The order deciding unit 230*y* is different from the order deciding unit 230 shown in FIG. 2 in that it includes a hereditary processing deciding unit 240. If a scheduling rule is determined to be a hereditary processing rule by the rule determining unit 231, the hereditary processing deciding unit 240 decides an order of processing based on a processing times calculated by the processing time calculating module 22 and hereditary information stored in the hereditary information storing file 64. As shown in FIG. 24, the hereditary processing deciding unit 240 includes a candidate generating unit 241, a candidate evaluating unit 242, a hereditary processing unit 243, and a candidate extracting unit 244.

Figure 26A:
Figure 26B:
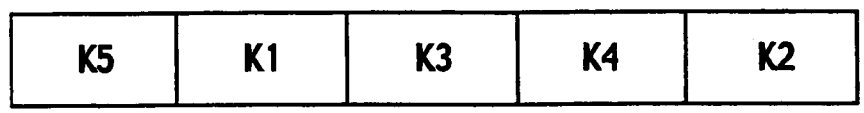

The candidate generating unit 241 reads processing requests of lots stored in the request storing file 61 shown in FIG. 22, and generates a plurality of candidates of order of processing. For example, if there are five lots requested to be processed, as shown in FIG. 26A, the candidate generating unit 241 sequentially allocates processing in order of numbers "K1", "K2", "K3, "K4", and "K5". Further, for example, as shown in FIG. 26B, the candidate generating unit 241 optionally rearrays the candidate order shown in FIG. 26A to "K5", "K2", "K1", "K4", and "K3" using random numbers.

Based on the processing times predicted by the processing time calculating module 22 shown in FIG. 22, the candidate evaluating unit 242 shown in FIG. 24 decides an order of processing for the plurality of candidates generated by the candidate generating unit 241 shown in FIG. 24 by allocating a CP aperture changing time and a beam adjusting time in order of lots when necessary, and calculates a total processing time as an evaluation value. It is to be noted that evaluation is higher for a candidate of a smaller evaluation value because its processing time is shorter.

Figure 25:
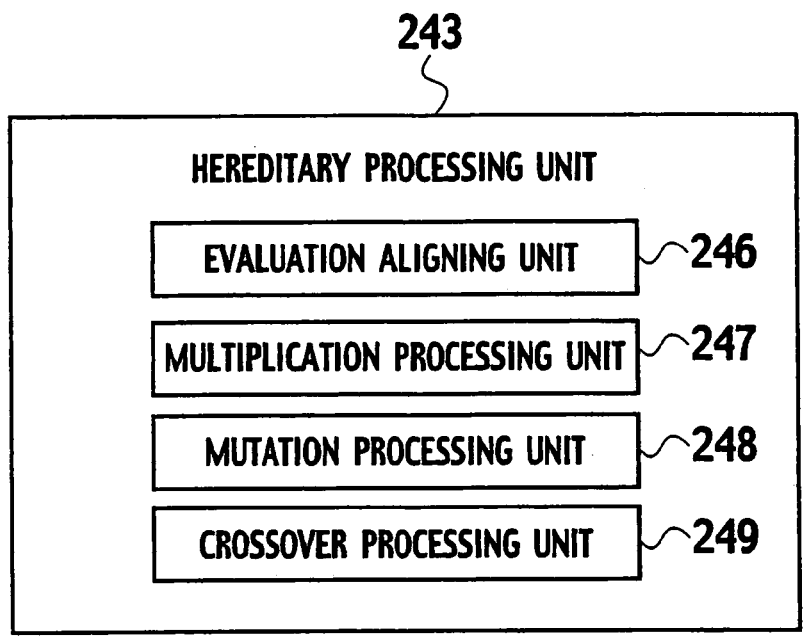
FIG. 25 is a block diagram of a hereditary processing unit according to the second modification of the present invention.

The hereditary processing unit 243 performs hereditary algorithm processing to generate candidates of higher evaluation based on the candidates generated by the candidate generating unit 241 and the evaluation values calculated by the candidate evaluating unit 242. As shown in FIG. 25, the hereditary processing unit 243 includes an evaluation aligning unit 246, a multiplication processing unit 247, a mutation processing unit 248, and a crossover processing unit 249.

The evaluation aligning unit 246 rearrays the candidates generated by the candidate generating unit 241 shown in FIG. 24 in ascending order of evaluation values calculated by the candidate evaluating unit 242, i.e., in descending order of evaluation. For example, as shown in FIG. 27A, if there are fifty candidates K1 to K50, the evaluation aligning unit 246 rearrays the candidates in order of the candidate K1 (evaluation value 75), K2 (evaluation value 77), . . . , K39 (evaluation value 128), K40 (evaluation value 129), K41 (evaluation value 129), . . . , K50 (evaluation vale 270).

Based on the multiplication rate stored in the hereditary information storing file 64 shown in FIG. 22, the multiplication processing unit 247 shown in FIG. 25 duplicates the candidates of high evaluation from among the candidates rearrayed by the evaluation aligning unit 246, and deletes the candidates of low evaluation corresponding to the duplication amount (multiplication processing). For example, if a multiplication rate is 20%, the multiplication processing unit 247 duplicates ten candidates K1 to K10 shown in FIG. 27A. Further, the multiplication processing unit 247 deletes the ten candidates K41 to K50 corresponding to the duplication amount. As a result, as shown in FIG. 27B, candidates K1 to K10 of high evaluation are generated by two in every candidate.

The mutation processing unit 248 shown in FIG. 25 performs processing for converting an optional cell (bit) of a candidate subjected to multiplication processing by the multiplication processing unit 247 (mutation processing) based on the mutation rate stored in the hereditary information storing file 64 shown in FIG. 22. For example, if a mutation rate is 1%, the mutation processing unit 248 performs mutation processing for 30 cells since there are 3000 cells if the number of candidates is 50 and the numbers of cells of each candidate is 60. It is to be noted that cells subjected to mutation processing are optionally decided by using random numbers. In other words, mutation processing may be carried out for 1 cell of 30 individual candidates, or for 30 cells of 1 individual candidate.

Figure 28:
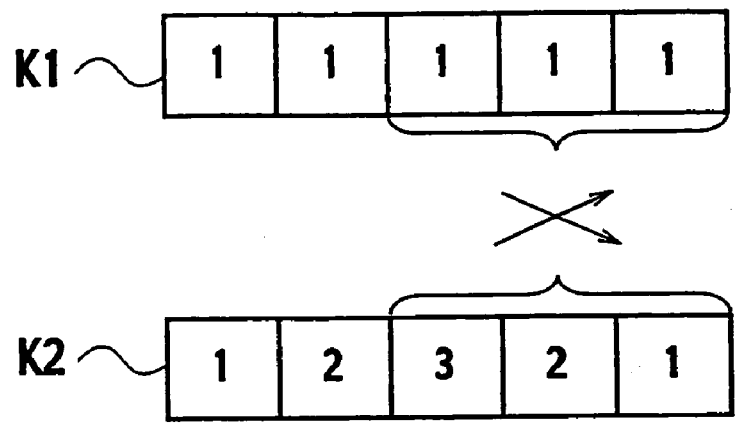
Figure 29A:
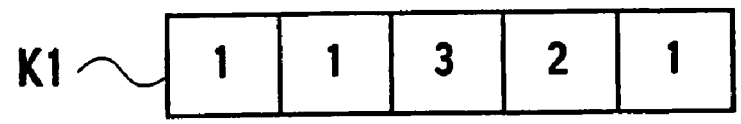
Figure 29B:
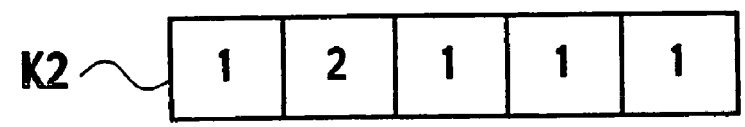

Based on the crossover rate stored in the hereditary information storing file 64 shown in FIG. 22, the crossover processing unit 249 shown in FIG. 25 performs processing of mutually replacing optional cells of two candidates for the candidates subjected to the mutation processing by the mutation processing unit 248 (crossover processing) For example, if a crossover rate is 10%, the crossover processing unit 249 replaces optional cells for 5 candidates if the number of candidates is 50. For example, as shown in FIG. 28, the crossover processing unit 249 replaces the rear 3 cells "111" of cells "11111" of the candidate K1 and the rear 3 cells "321" of cells "12321" of the candidate K2. As a result, the candidate K1 becomes "11321" as shown in FIG. 29A, the candidate K2 becomes "12111" as shown in FIG. 29B. It is to be noted that cells and a replacing sequence subjected to crossover processing are decided randomly. In the crossover processing, the cells of the same position are replaced for the two or more candidates. Thus, even when cells of an order sequence deciding unit are included, it is not necessary to consider constraints such as mutation processing.

The candidate extracting unit 244 shown in FIG. 24 extracts candidates of highest evaluation from among the candidates including the cells subjected to the mutation processing by the mutation processing unit 248, and decides an order of processing. Other components are similar to those of the EB lithography system shown in FIG. 1, and thus repeated explanation will be omitted.

Next, an EB lithography method according to the second modified example of the present invention will be described by referring to flowcharts of FIGS. 30 and 31. It is assumed that the time designation rule of the preparation rule, the priority designation rule of the fixed rule, and the minimum slack rule of the dynamic rule, and the hereditary processing rule are stored in the scheduling rule storing file 63.

Figure 30:
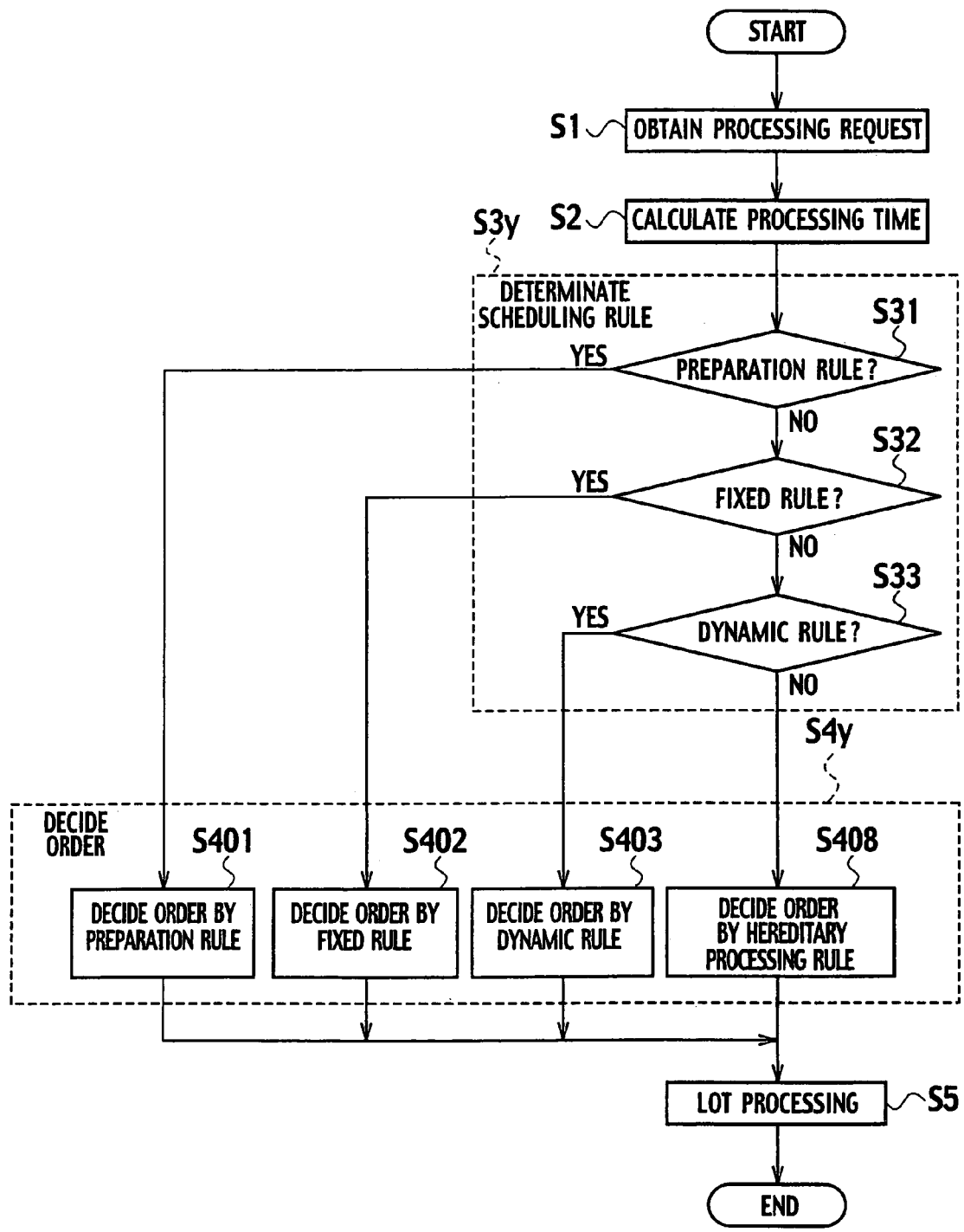
FIGS. 30 and 31 are flow charts for explaining a method of EB lithography according to the second modification of the present invention.
Figure 31:
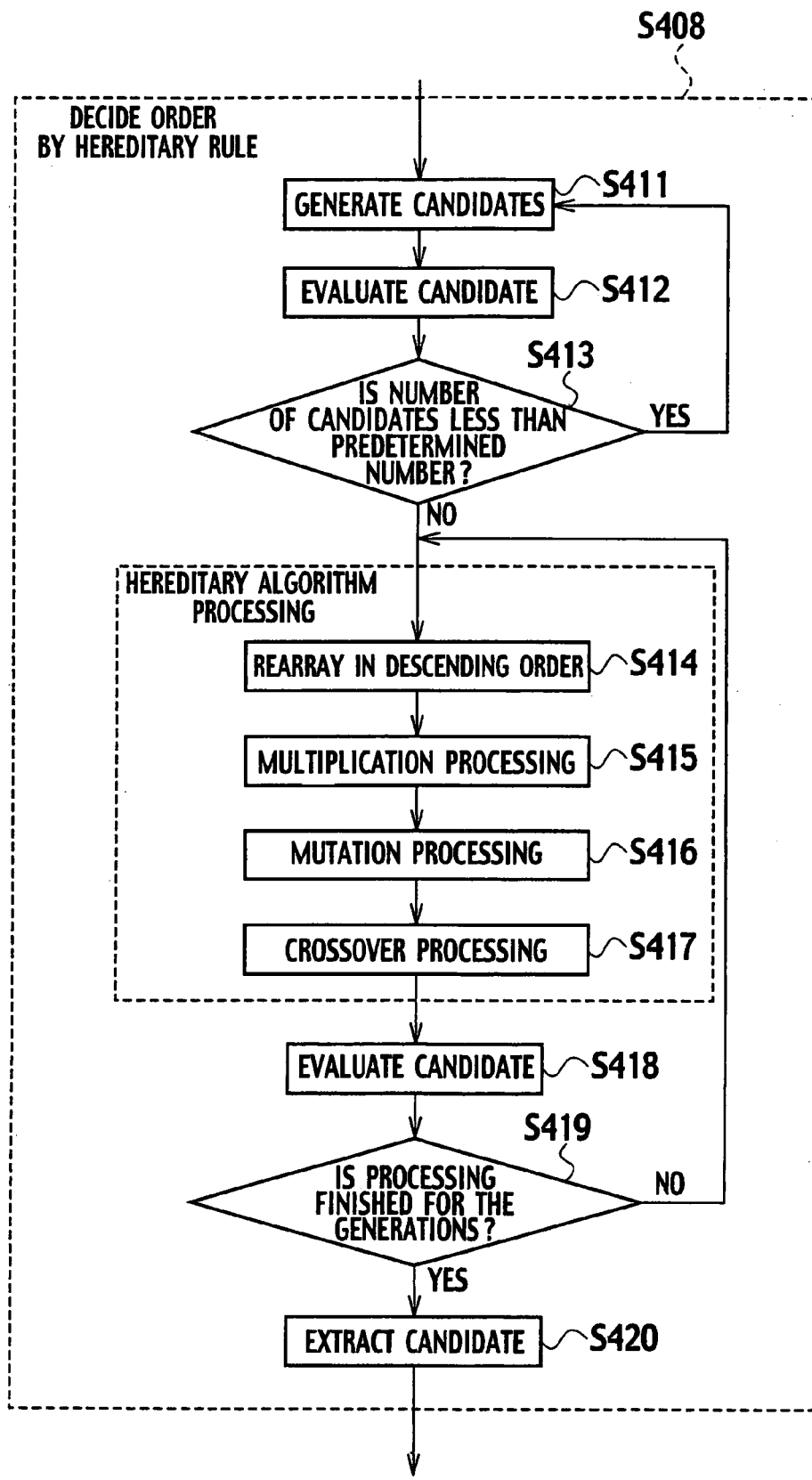

Steps S1, S2, S31 to S32 of FIG. 30 are similar to those of FIG. 6, and thus repeated explanation will be avoided. In a step S33, if the priority designation rule is not determined by the rule determining unit 231 shown in FIG. 23, the process proceeds to a step S411 of FIG. 31.

In the step S411, the candidate generating unit 241 shown in FIG. 24 reads the processing requests of lots stored in the request storing file 61 shown in FIG. 22, and generates a plurality of candidates of order of processing of the lots. In a step S412, the candidate evaluating unit 242 shown in FIG. 24 calculates a total lithography time as an evaluation value for the candidates generated in the step S411. In a step S413, if the number of candidates is less than a predetermined number, the process of the steps S411 and S412 is repeated. On the other hand, if the number of candidates is not less than the predetermined number, the process proceeds to a step S414.

In the step S414, the evaluation aligning unit 246 shown in FIG. 25 rearrays the candidates in descending order of evaluation based on the evaluation value calculated in the step S414. In a step S415, the multiplication processing unit 247 shown in FIG. 25 duplicates the candidates of high evaluation based on a multiplication rate, and deletes the candidates of low evaluation corresponding to the duplication amount. In a step S416, the mutation processing unit 248 shown in FIG. 25 converts an optional cell (bit) of a candidate based on a mutation rate. In a step S417, the crossover processing unit 249 shown in FIG. 25 replaces optional cells of two candidates based on a crossover rate.

In a step S418, the candidate evaluating unit 242 shown in FIG. 24 calculates evaluation values for the candidates processed up to the step S417 as in the case of the step S412. In a step S419, if hereditary algorithm processing is not finished for predetermined generations, the process of the steps S414 to S418 is repeated. On the other hand, if the hereditary algorithm processing is finished for the predetermined generations, the process proceeds to a step S420.

In the step S420, the candidate extracting unit 244 shown in FIG. 24 decides an order of processing by employing the candidate of highest evaluation among the candidates whose evaluation values have been calculated in the step S418. In a step S5, the lithography control module 24 shown in FIG. 1 outputs a control signal to the aperture manager 91 and the lithography tool 92 in accordance with the order of processing decided in the step S420. The aperture manager 91 and the lithography tool 92 processes the lots by using CP apertures based on the control signal output from the lithography control module 24.

As described above, according to the second modified example, as in the case of the embodiment, it is possible to automatically manage the order of processing of actually inputting the lots requested to be processed to the device and the setting of the schedule of timing of inputting to the device. It is possible to efficiently operate the EB lithography system compatible to large-variety small volume manufacturing.

Furthermore, the processing is carried out only for the predetermined generations by performing the hereditary algorithm processing at the hereditary processing unit 243 shown in FIG. 24. Thus, even if the number of orders increases, a fractional increase in operation is prevented. Accordingly, a candidate near the best evaluation can be decided within a relatively short time. As a result, for the order of rearraying the candidates, it is not necessary to obtain evaluation and to decide evaluation for an enormous number of all candidate combinations by using a round-robin calculation method, and processing can be achieved at a computing speed of a current general computer.

Other Embodiment

Various modifications will become possible for those skilled in the art after receiving the teachings of the present disclosure without departing from the scope thereof.

Figure 32:
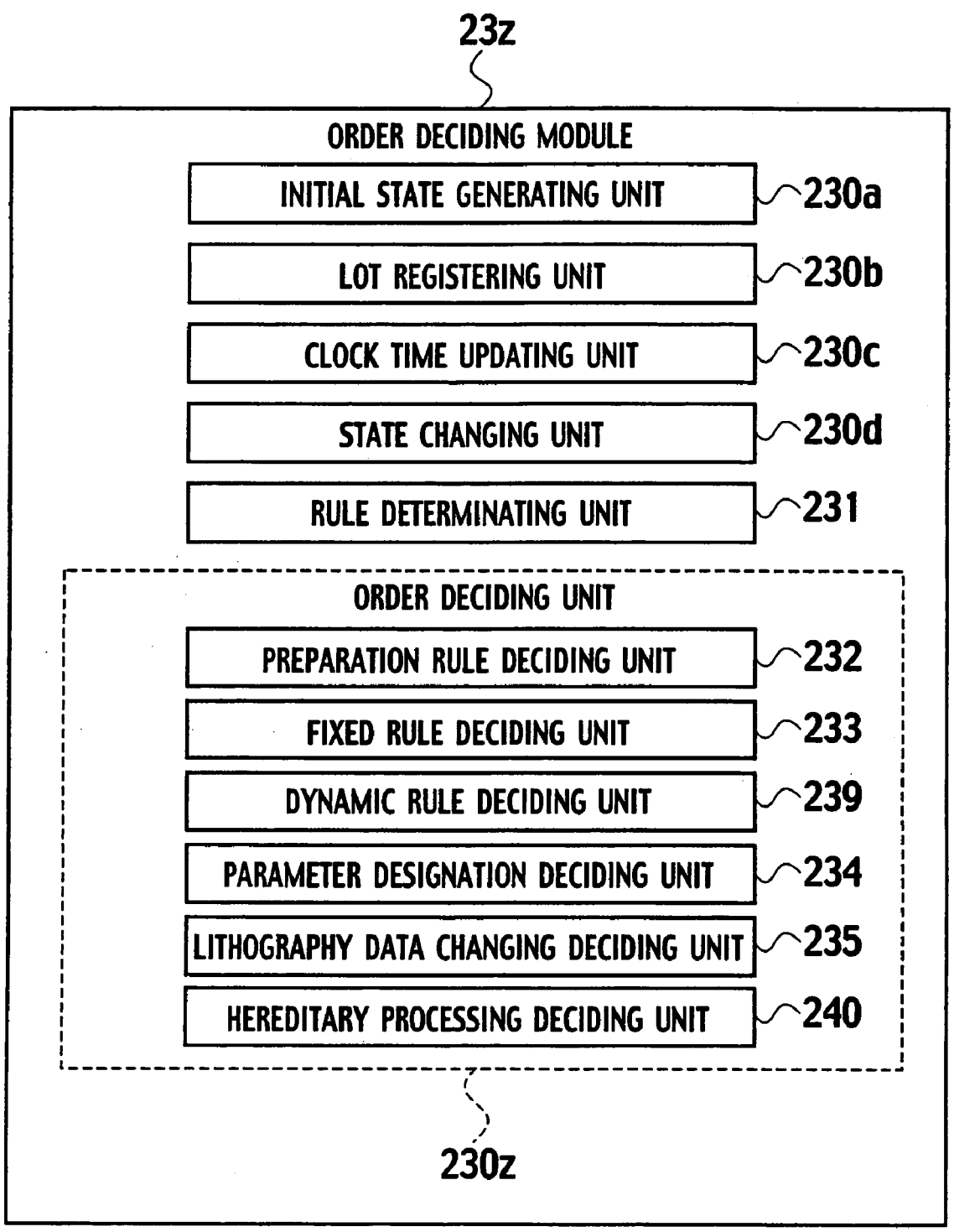
FIG. 32 is a block diagram showing an order deciding module according to the other embodiment of the present invention.

For example, as shown in FIG. 32, in place of the order deciding module 23 which includes the order deciding unit 230 shown in FIG. 1, an order deciding module 23z that includes an order deciding unit 230z may be provided. The order deciding unit 230z includes a preparation rule deciding unit 232, a fixed rule deciding unit 233, a parameter designation deciding unit 234, a lithography data changing deciding unit 23, and a hereditary processing deciding unit 240. Each of the preparation rule deciding unit 232, the fixed rule deciding unit 233, the parameter designation deciding unit 234, the lithography data changing deciding unit 235, and the hereditary processing deciding unit 240 only needs to decide an order of processing based on a scheduling rule determined by the rule determining unit 231.

Even when the rule determining unit 231 determines the time designation rule, the priority designation rule, the parameter designation rule, the lithography data changing rule or the like, the hereditary processing deciding unit 240 may decide an order of processing in place of the preparation rule deciding unit 232, the fixed rule deciding unit 233, the parameter designation deciding unit 234, the lithography data changing deciding unit 235, or the hereditary processing deciding unit 240. For example, in the case of the time designation rule, the candidate evaluating unit shown in FIG. 24 determines if overlapping occurs between the schedule time and each lot processing for the candidates generated by the candidate generating unit 241, and targets the candidates with no overlapping. Even when the rule determining unit 231 determines the priority designation rule, the parameter designation rule, the lithography data changing rule or the like, the candidate evaluating unit 242 judges whether conditions such as priority or parameters are satisfied or not for the candidates generated by the candidate generating unit 241, and targets the candidates which satisfy the conditions.

Figure 33:
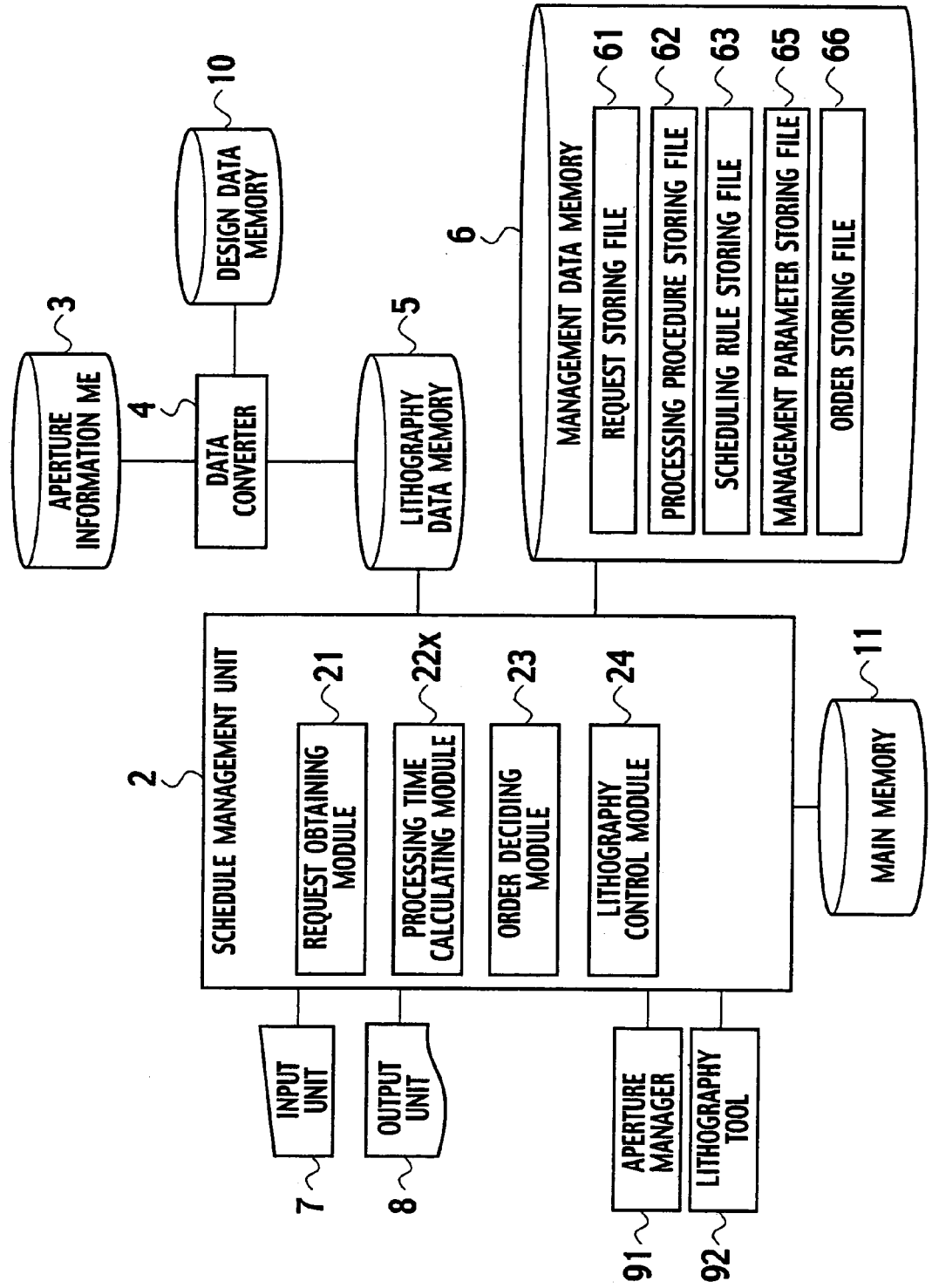
FIGS. 33 and 34 are block diagrams of an EB lithography system according to the other embodiment of the present invention.

A processing time calculating module 22x of an EB lithography system shown in FIG. 33 is different from that of the EB lithography system shown in FIG. 1. The processing time calculating module 22x does not read the aperture information contained in the lithography data stored in the lithography data memory 5 but directly reads the aperture information from the aperture information memory 3, and calculates a processing time necessary for processing the plurality of lots by using CP apertures corresponding to the lots.

Figure 34:
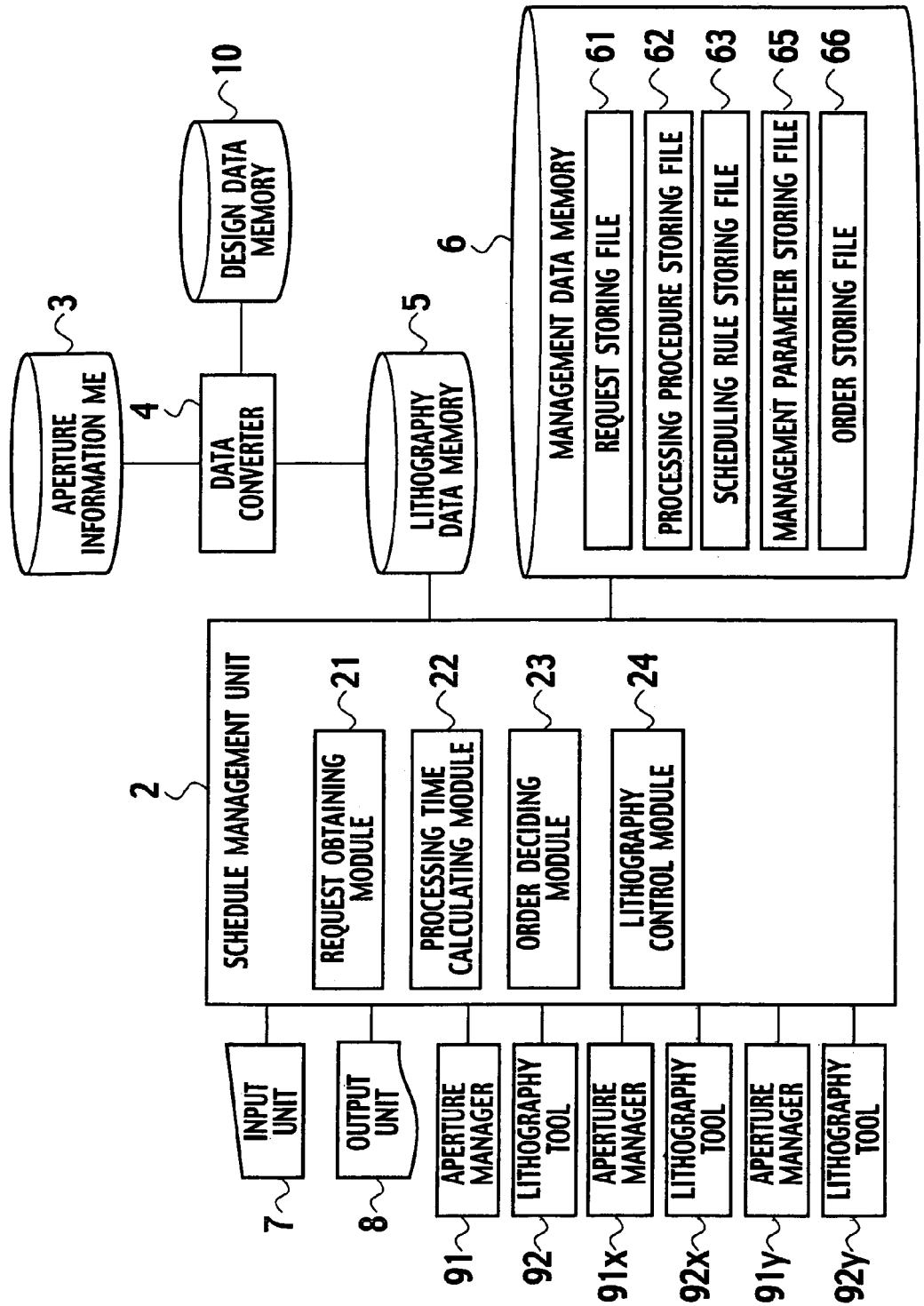

An EB lithography system shown in FIG. 34 is different from the EB lithography system shown in FIG. 1 in that it includes a plurality of aperture managers 91, 91x and 91y and a plurality of lithography tools 92, 92x and 92y. In the case of including the plurality of aperture managers 91, 91x and 91y and the plurality of lithography tools 92, 92x and 92y, the order deciding module 23 judges a plurality of lots input to each of the lithography tools 92, 92x and 92y, and decides an order of processing the plurality of lots for each of the lithography tools 92, 92x and 92y.

Figure 35:
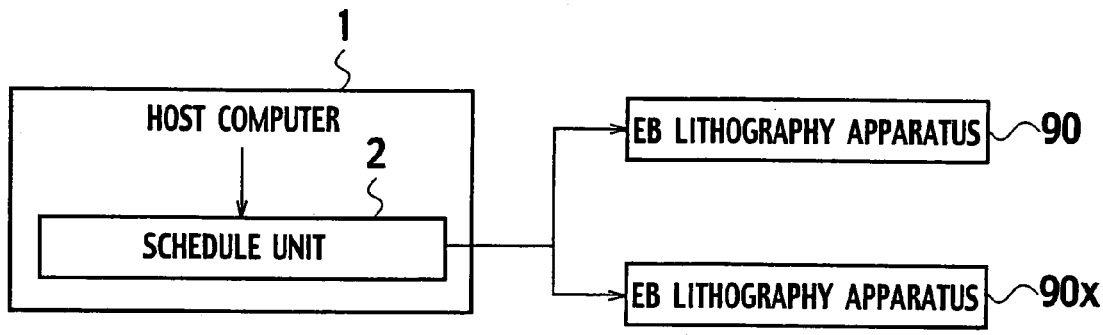
FIGS. 35 to 37 are block diagrams showing a relation between schedule management unit(s), a host computer and EB lithography devices according to the other embodiment of the present invention.

As shown in FIG. 35, the schedule management unit 2 may be incorporated in a host computer 1 of a plant. The aperture information memory 3, the data converter 4, the lithography data memory 5, the management data memory 6, the input unit 7, the output unit 8, the design data memory 10, the main memory 11 and the like (not shown) shown in FIG. 1 are connected to the schedule management unit 2. The schedule management unit 2 is connected to a plurality of EB lithography apparatus 90 and 90x. Each of the EB lithography apparatus 90 and 90x includes the aperture manager 91 and the lithography tool 92 shown in FIG. 1. The host computer 1 manages the schedules of the EB lithography apparatus 90 and 90x in the entire plant. The host computer 1 passes lot information to be processed to the schedule management unit 2. The schedule management unit 2 adds the requested lot information from the host computer 1 to its own managed queuing list, and starts scheduling. When an optimal schedule is obtained, information of lots to be individually processed is sent to the EB lithography apparatus 90 and 90x to instruct lot processing. Each of the EB lithography apparatus 90 and 90x executes lot processing in accordance with the instruction of the schedule management unit 2, and notifies its completion to the schedule management unit 2 after the processing is finished. Referring to FIG. 27, since the schedule management unit 2 is mounted on the host computer 1 of the plant, the schedule management unit 2 can easily obtain an end time of a next step regarding an arrival time of a reinput lot.

Figure 36:
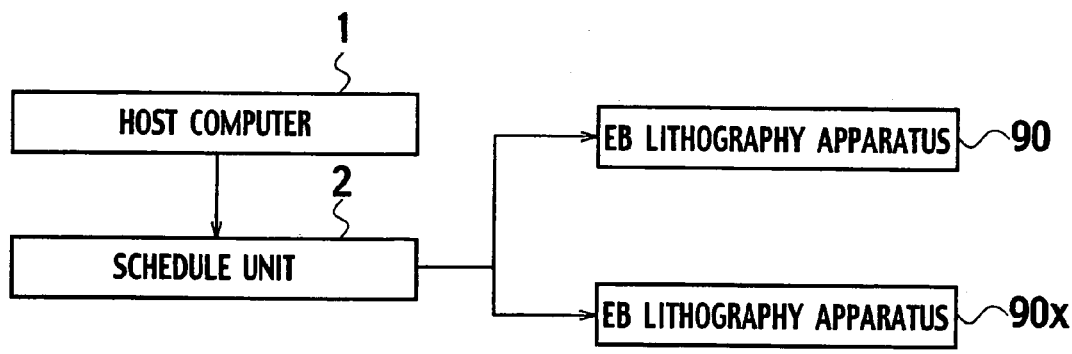

As shown in FIG. 36, the schedule management unit 2 shown in FIG. 1 may be connected between the host computer 1 of the plant and the plurality of EB lithography apparatus 90 and 90x. The schedule management unit 2 manages the plurality of EB lithography apparatus 90 and 90x. The schedule management unit 2 is different from that shown in FIG. 27 in that it has only information of the EB lithography apparatus 90 and 90x it manages itself. Accordingly, a return time from a next step must be obtained by making a request to the host computer 1 of the plant from the schedule management unit 2.

Figure 37:
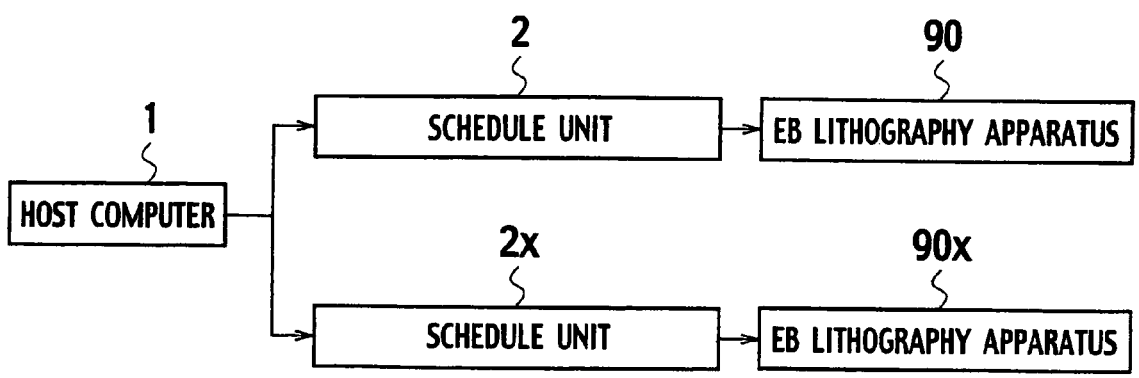

As shown in FIG. 37, the schedule management unit 2 shown in FIG. 1 and a schedule management unit 2x similar in configuration to the schedule management unit 2 may be connected between the host computer 1 of the plant and the EB lithography apparatus 90 and 90x. The plurality of schedule management units 2 and 2x manage the individual EB lithography apparatus 90 and 90x. The plurality of schedule management units 2 and 2x are different from those shown in FIGS. 35 and 36 in that they manage only the schedules of the EB lithography apparatus 90 and 90x in charge.

The embodiment has been described by ways of thee EB lithography system that uses the character projection (CP) lithography system. However, the invention may be applied to other lithography systems. For example, the invention can be applied to a device of a low-energy electron beam projection system which places an aperture mask of equal magnification directly on a wafer, and applying a low-energy electron beam on the aperture mask to print a pattern on the wafer. Additionally, the invention can be applied to a device of a high-energy electron beam projection system which uses an aperture mask larger by 4 to 5 times than a chip size, performs driving by synchronizing the aperture mask with a wafer, and applying a high-energy electron beam on the aperture mask to reduce and transfer a pattern to the wafer. In this case, a plurality of function blocks only need to be mounted on the aperture mask. Information of an aperture mask and function blocks necessary for each product only needs to be replaced by information of the CP aperture and the character pattern of described in the aforementioned embodiment.

What is claimed is:

1. An electron beam lithography system comprising:
   a lithography tool configured to write different patterns onto a plurality of substrates, which are classified into a plurality of lots, respectively, using sequentially a plurality of sets of apertures through which electron beams pass;
   an aperture manager configured to select an optimum set of apertures suited to a pattern corresponding to each of the lots from among the sets of apertures, respectively;
   a request obtaining module configured to obtain a plurality of processing requests for each of the lots;
   a processing procedure storing file storing a plurality of processing procedures defined for each of the lots;
   a processing time calculating module configured to calculate corresponding processing times of each of the lots using the set of apertures suited for each of the lots based on corresponding processing procedures; and
   an order deciding module configured to decide an order of processing the lots based on each of the processing times for each of the lots.

2. The electron beam lithography system of claim 1, wherein the order deciding module comprises:
   a rule determinating unit configured to determine a scheduling rule for the processing procedures; and
   an order deciding unit configured to decide the order of processing of the lots based on the processing time using the scheduling rule.

3. The electron beam lithography system of claim 1, wherein the order deciding module gives priority to one of the lots for which a production instruction comes first.

4. The electron beam lithography system of claim 1, wherein the order deciding module allocates the lots to prevent overlapping of beam adjusting time of the lithography tool.

5. The electron beam lithography system of claim 1, wherein the order deciding module allocates the lots based on a minimum number of changes of the apertures.

6. The electron beam lithography system of claim 1, wherein the order deciding module allocate the lots using the same aperture in succession.

7. The electron beam lithography system of claim 1, wherein the order deciding module gives priority to one of the lots of high priority stored in the processing procedure storing file.

8. The electron beam lithography system of claim 1, wherein the order deciding module gives priority to one of the lots arriving first at the lithography tool.

9. The electron beam lithography system of claim 1, wherein the order deciding module gives priority to one of the lots requiring earliest delivery.

10. The electron beam lithography system of claim 1, wherein the order deciding module gives priority to one of the lots requiring a minimum work time.

11. The electron beam lithography system of claim 1, wherein the order deciding module gives priority to one of the lots requiring a maximum time for processing.

12. The electron beam lithography system of claim 1, wherein the order deciding module gives priority to one of the lots having a minimum slack until delivery.

13. The electron beam lithography system of claim 1, wherein the order deciding module decides priority of the lots based on parameters of the lots.

14. The electron beam lithography system of claim 1, wherein the order deciding module allocate the lots having the same lithography condition in succession.

15. The electron beam lithography system of claim 1, wherein the order deciding module allocates one of the lots requiring low writing accuracy after another one of the lots requiring high writing accuracy.

16. The electron beam lithography system of claim 1, wherein the order deciding module allocates the lot by changing lithography data of the lot.

17. The electron beam lithography system of claim 1, wherein the order deciding module generates a plurality of candidates of the orders; calculates evaluation values of the each candidates; and adapts one of the candidates having the highest evaluation value.

18. A computer implemented method of electron beam lithography comprising:
   obtaining a plurality of processing requests for each of a plurality of lots;
   selecting an optimum set of apertures suited to a pattern corresponding to each of the lots from among a plurality of apertures, respectively;
   calculating corresponding processing times of each of the lots using the set of apertures suited for each of the lots based on a plurality of processing procedures defined for each of the lots;
   deciding an order of processing the lots based on each of the processing times for each of the lots; and
   writing different patterns onto a plurality of substrates, which are classified into the lots, respectively, using sequentially the set of apertures suited for each of the lots through which electron beams pass, based on the order.

19. A program configured to be executed by a computer for executing an application on an electron beam lithography system, the program comprising:
   instructions for obtaining a plurality of processing requests for each of a plurality of lots;
   instructions for selecting an optimum set of apertures suited to a pattern corresponding to each of the lots from among a plurality of sets of apertures, respectively;
   instructions for calculating corresponding processing times of each of the lots using the set of apertures determined for each of the lots based on a plurality of processing procedures defined for each of the lots;
   instructions for deciding an order of processing the lots based on each of the processing times for each of the lots; and
   instructions for writing patterns onto a plurality of substrates, which are classified into the lots, respectively, using sequentially the set of apertures suited for each of the lots through which electron beams pass, based on the order.

20. A method for manufacturing a semiconductor device using direct writing, comprising:
   generating layout data of device patterns of a plurality of lots;
   converting the layout data of each of the lots into lithography data;
   selecting an optimum set of apertures suited to a pattern corresponding to each of the lots from among a plurality of apertures, respectively;
   obtaining a plurality of processing requests for each of the lots;

calculating corresponding processing times of each of the lots using the set of apertures suited for each of the lots based on a plurality of processing procedures defined for each of the lots;

deciding an order of processing the lots based on each of the processing times for each of the lots; and writing different patterns onto a plurality of substrates, which are classified into the lots, respectively, using sequentially the set of apertures suited for each of the lots through which electron beams pass, based on the order.

* * * * *